US010400402B1

(12) United States Patent
Sanders et al.

(10) Patent No.: US 10,400,402 B1
(45) Date of Patent: Sep. 3, 2019

(54) WALL PANELS, BARRIER WALL CONSTRUCTED FROM SAME, AND METHODS OF MAKING BOTH

(71) Applicant: Mute Wall Systems, Inc., Peoria, AZ (US)

(72) Inventors: Keith A. Sanders, Litchfield Park, AZ (US); Donald J. Parks, Prescott, AZ (US)

(73) Assignee: Mute Wall Systems, Inc., Peoria, AZ (US)

( * ) Notice: Subject to any disclaimer, the term of this patent is extended or adjusted under 35 U.S.C. 154(b) by 0 days.

(21) Appl. No.: 16/249,587

(22) Filed: Jan. 16, 2019

Related U.S. Application Data

(63) Continuation-in-part of application No. 15/920,132, filed on Mar. 13, 2018, now Pat. No. 10,221,529.

(51) Int. Cl.
| | |
|---|---|
| *E01F 15/00* | (2006.01) |
| *E01F 15/08* | (2006.01) |
| *E04H 17/16* | (2006.01) |
| *H02G 3/38* | (2006.01) |
| *H05K 9/00* | (2006.01) |
| *H02G 1/08* | (2006.01) |
| *E01F 8/00* | (2006.01) |

(52) U.S. Cl.
CPC ......... *E01F 15/086* (2013.01); *E04H 17/168* (2013.01); *H02G 1/08* (2013.01); *H02G 3/388* (2013.01); *H05K 9/00* (2013.01); *E01F 8/0017* (2013.01); *E01F 8/0023* (2013.01)

(58) Field of Classification Search
CPC ....... E01F 8/0017; E01F 8/0023; E01F 15/08; E01F 15/186; E04H 17/168; H02G 3/30; H05K 9/00
USPC ............................................................ 404/6
See application file for complete search history.

(56) References Cited

U.S. PATENT DOCUMENTS

| | | | |
|---|---|---|---|
| 1,661,128 A | 2/1928 | Mankedick | |
| 1,668,551 A | 5/1928 | Crosman et al. | |
| 2,102,447 A | * 12/1937 | Whitacre | .......... E04B 2/52 |
| | | | 52/223.7 |
| 2,107,691 A | 2/1938 | Corser | |
| 2,130,231 A | 9/1938 | Forciea | |
| 2,664,740 A | 1/1954 | Cochrane | |
| 2,676,482 A | 4/1954 | Wilson | |
| 3,193,255 A | 7/1965 | Burdett | |
| 3,295,278 A | 1/1967 | Muhm | |
| 3,353,315 A | 11/1967 | Barker | |
| 3,381,483 A | 5/1968 | Huthsing, Jr. | |
| 3,600,867 A | 8/1971 | Shuey | |
| 3,603,053 A | 9/1971 | Van Loghem | |

(Continued)

*Primary Examiner* — Raymond W Addie
(74) *Attorney, Agent, or Firm* — Brian M. Kaufman; Robert D. Atkins; Patent Law Group: Atkins and Associates, P.C.

(57) ABSTRACT

A barrier wall has a first vertical support and a second vertical support. A first wall panel is disposed between the first vertical support and second vertical support. A second wall panel is disposed between the first vertical support and second vertical support over the first wall panel. An I-beam is disposed between the first wall panel and second wall panel. The I-beam includes a first flange and second flange extending into the first wall panel and second wall panel. A cable is disposed between the first wall panel and second wall panel and attached to the first vertical support.

19 Claims, 38 Drawing Sheets

FIG. 7a

(56) References Cited

U.S. PATENT DOCUMENTS

| | | | |
|---|---|---|---|
| 3,617,028 A | 11/1971 | Bach et al. | |
| 3,732,653 A * | 5/1973 | Pickett | E04H 17/16 256/19 |
| 3,876,185 A * | 4/1975 | Welch | E01F 15/146 256/1 |
| 4,031,285 A | 6/1977 | Miller et al. | |
| 4,063,714 A | 12/1977 | Kirkwood | |
| 4,143,495 A | 3/1979 | Hintz | |
| 4,269,545 A * | 5/1981 | Finney | E02D 29/02 256/19 |
| 4,284,447 A | 8/1981 | Dickens et al. | |
| 4,358,090 A | 11/1982 | Glaesener | |
| 4,364,546 A | 12/1982 | Lyman et al. | |
| 4,566,558 A | 1/1986 | Link, Jr. et al. | |
| 4,621,477 A | 11/1986 | Kinst | |
| 4,641,468 A | 2/1987 | Slater | |
| 4,685,656 A | 8/1987 | Lee et al. | |
| 4,726,567 A * | 2/1988 | Greenberg | E04B 2/16 256/19 |
| 4,754,587 A | 7/1988 | Glaser | |
| 5,015,119 A | 5/1991 | Schmanski | |
| 5,100,107 A | 3/1992 | Latta | |
| 5,426,267 A | 6/1995 | Underhill et al. | |
| 5,524,400 A | 6/1996 | Schmechel | |
| 5,566,518 A * | 10/1996 | Martin | E04B 2/8652 52/309.17 |
| 5,572,847 A | 11/1996 | Elmore et al. | |
| 5,625,989 A * | 5/1997 | Brubaker | E04B 2/54 249/40 |
| 5,702,090 A | 12/1997 | Edgman | |
| 5,799,462 A | 9/1998 | McKinney | |
| 5,893,248 A | 4/1999 | Beliveau | |
| 5,966,885 A | 10/1999 | Chatelain | |
| 5,984,044 A * | 11/1999 | Christensen | E01F 8/0023 181/210 |
| 6,138,426 A | 10/2000 | Mork et al. | |
| 6,164,035 A | 12/2000 | Roberts | |
| 6,240,693 B1 | 6/2001 | Komasara et al. | |
| 6,371,699 B1 | 4/2002 | Weinreb | |
| 6,408,594 B1 | 6/2002 | Porter | |
| 6,609,347 B2 | 8/2003 | Morrow | |
| 6,698,157 B1 | 3/2004 | Porter | |
| 6,701,684 B2 | 3/2004 | Stadter | |
| 6,782,673 B2 | 8/2004 | Azar | |
| 6,883,786 B2 | 4/2005 | Bebendorf | |
| 7,665,264 B1 | 2/2010 | Wolfe | |
| 7,762,033 B2 | 7/2010 | Scott et al. | |
| 8,181,418 B2 * | 5/2012 | Barnet | B66C 1/66 52/742.13 |
| 8,468,767 B1 | 6/2013 | McBride | |
| 2002/0134043 A1 | 9/2002 | Winteifeld | |
| 2002/0170259 A1 | 11/2002 | Ferris | |
| 2005/0257494 A1 | 11/2005 | Brandes | |
| 2006/0026922 A1 | 2/2006 | Li | |
| 2006/0183269 A1 | 8/2006 | Fuergut et al. | |
| 2006/0191232 A1 | 8/2006 | Salazar et al. | |
| 2007/0227086 A1 * | 10/2007 | Beavers | E04B 1/14 52/309.7 |
| 2007/0245660 A1 | 10/2007 | Scott | |
| 2010/0180527 A1 * | 7/2010 | Kim | E04C 1/40 52/309.13 |

\* cited by examiner

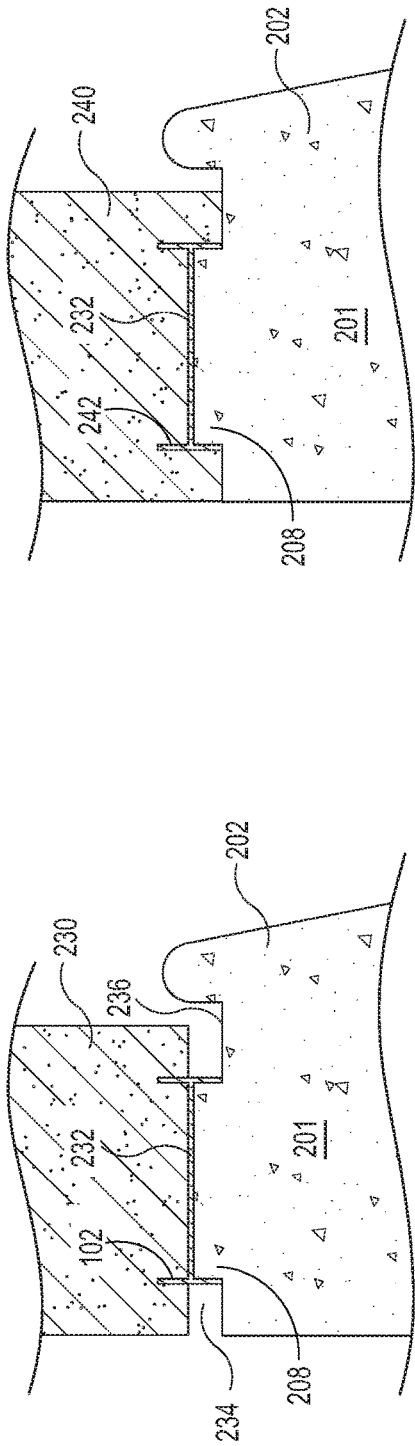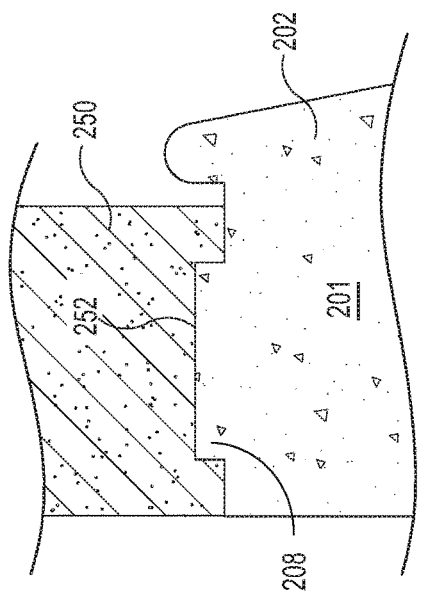
FIG. 6f
FIG. 6g
FIG. 6e

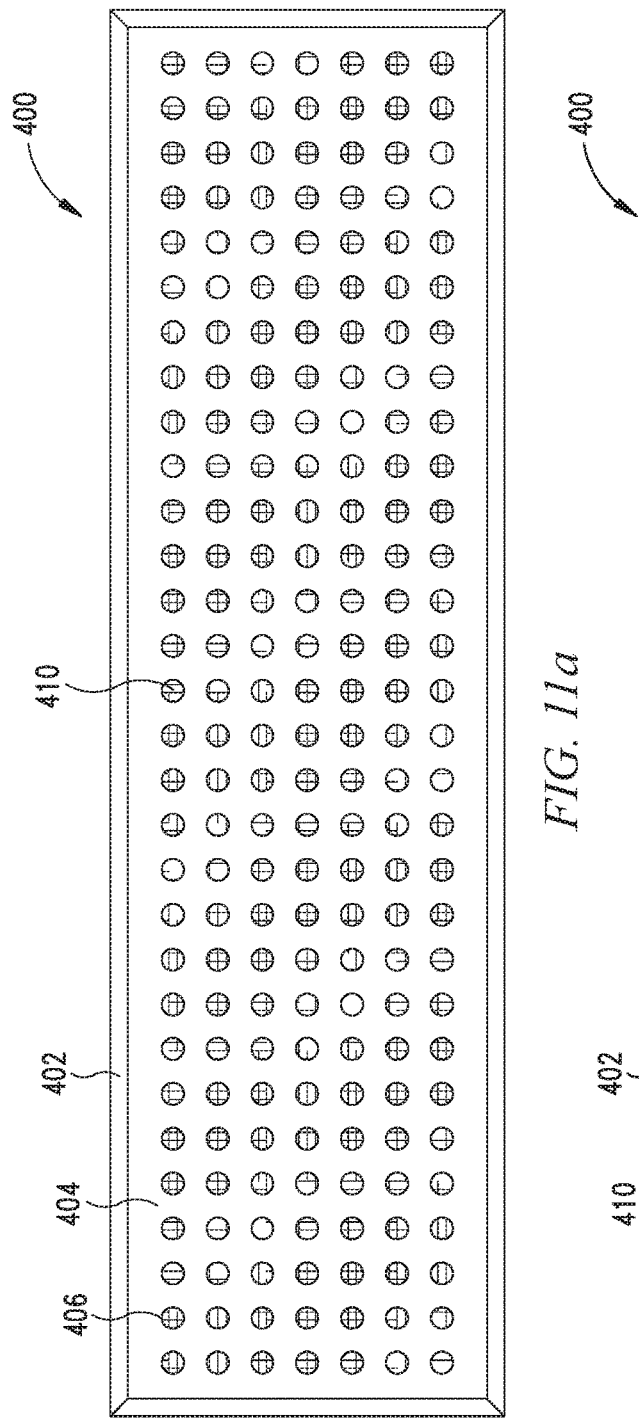
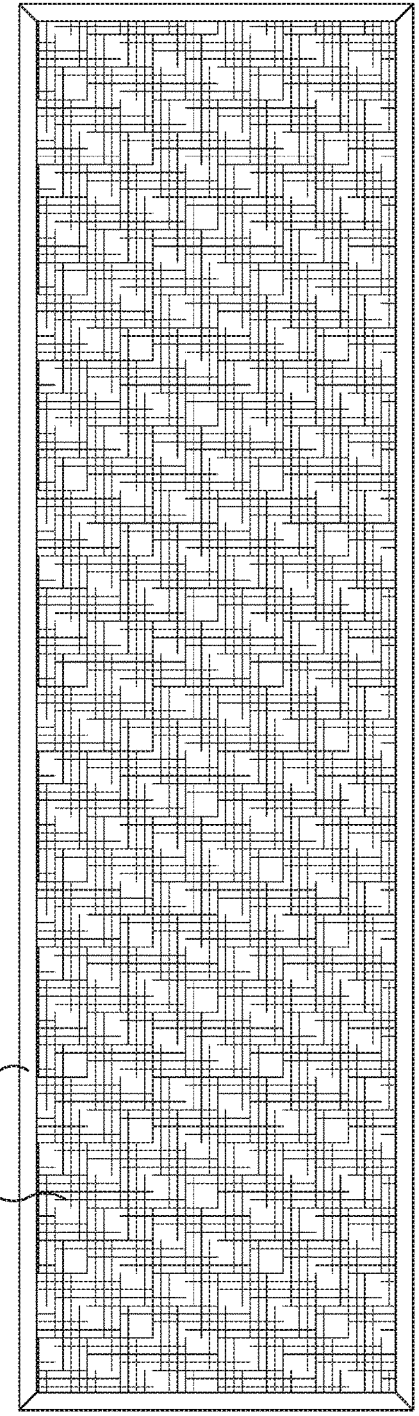
FIG. 11a
FIG. 11b

WALL PANELS, BARRIER WALL CONSTRUCTED FROM SAME, AND METHODS OF MAKING BOTH

CLAIM TO DOMESTIC PRIORITY

The present application is a continuation-in-part of U.S. patent application Ser. No. 15/920,132, now U.S. Pat. No. 10,221,529, filed Mar. 13, 2018, which application is incorporated herein by reference.

FIELD OF THE INVENTION

The present invention relates in general to barrier wall construction and, more particularly, to improved wall panels, barrier walls constructed from the wall panels, and methods of forming the wall panels and the barrier wall from the wall panels.

BACKGROUND OF THE INVENTION

Barrier walls are commonly formed along one or both sides of highways and other major roads. Barrier walls along roadways reduce noise that nearby residences experience, which might otherwise be disruptive to everyday life. Barrier walls contribute to safety by keeping cars or errant car parts contained within the roadway area. Barrier walls are also used to block certain areas from the public view, such as around power stations and other critical infrastructure.

One method of forming barrier walls uses foam blocks. FIG. 1a illustrates a wall panel 10 that is used to build a barrier wall. Wall panel 10 is a block formed from expanded polystyrene (EPS) or another appropriate foam material. Wall panel 10 is a solid block, and includes foam extending to six externally oriented faces. The faces are oriented substantially perpendicular and parallel to each other to form a box shape. Wall panel 10 includes a length dimension L, a width dimension W, and a height dimension H, as labelled in FIG. 1a. Top and bottom surfaces 12 of wall panel 10 extend along primarily the length and width dimensions. Wall panel 10 includes two side surfaces 14 that extend along primarily the height and length dimensions, and two end surfaces 16 that extend along primarily the height and width dimensions.

One method of forming a barrier wall 18 from wall panels 10 is illustrated in FIG. 1b. Wall panels 10 are stacked between two adjacent vertical I-beam supports 20. The vertical supports 20 are I-beams that include a center web 22 connecting two opposing flanges 24. The combination of web 22 and flanges 24 looks similar to a capital letter 'I' when support 20 is viewed from an end, thus the support is commonly referred to as an I-beam. Supports 20 include baseplates 26 welded or otherwise attached at lower ends of the supports. Supports 20 are attached to concrete footings or caissons 30, which are embedded in the ground, through baseplates 26 and bolts 32.

Once supports 20 are securely attached to the ground through footings 30 and baseplates 26, the supports extend vertically from the ground. Adjacent supports 20 are oriented with flanges 24 in parallel to each other so that wall panels 10 can be inserted between the flanges of both support 20a and support 20b simultaneously. A section of barrier wall 18 is completed by stacking any desired number of wall panels 10 between two adjacent supports 20. Any number of wall sections can be formed by using additional supports 20 and disposing additional wall panels 10 between each two adjacent supports.

FIG. 1b illustrates two wall sections, one section is being formed between supports 20a and 20b, with panel 10a disposed on the ground and panel 10b being stacked over panel 10a. Additional panels 10 are stacked to attain the desired barrier wall height. A second wall section has already been formed on the other side of support 20b using panels 10c, 10d, 10e, and 10f. Another support 20 extends from the ground off the page of FIG. 2b, at the opposite end of panels 10c-10f. Barrier wall 18 can be made longer by placing additional supports 20 on either side of the wall and stacking additional wall panels 10 between the open flanges of pillars 20.

Forming barrier wall 18 from foam block wall panels 10 has many advantages over other known types of barrier walls. Wall panels 10 are light and relatively easy to construct a barrier wall from. Wall panel 10 can be fully formed away from the job site, and simply brought in and stacked between supports 20 once formed. However, barrier wall 18 with wall panels 10 also has significant downsides. Foam block wall panels 10 are weak, and not easily able to stop a moving vehicle. Foam block wall panels 10 do not offer sufficient sound dampening capabilities to meet modern standards. In addition, foam block wall panels 10 are not attached to supports 20. If impacted by a vehicle, wall panels 10 may be knocked loose and be a traffic hazard or cause damage and possibly even injury.

Therefore, a need exists for improved foam block wall panels, and a barrier wall made with the same.

BRIEF DESCRIPTION OF THE DRAWINGS

FIGS. 6a-6g illustrate a barrier wall incorporating a traffic barrier;

FIGS. 11a-11h illustrate sound absorbing panels mounted on a barrier wall; and

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 2A:
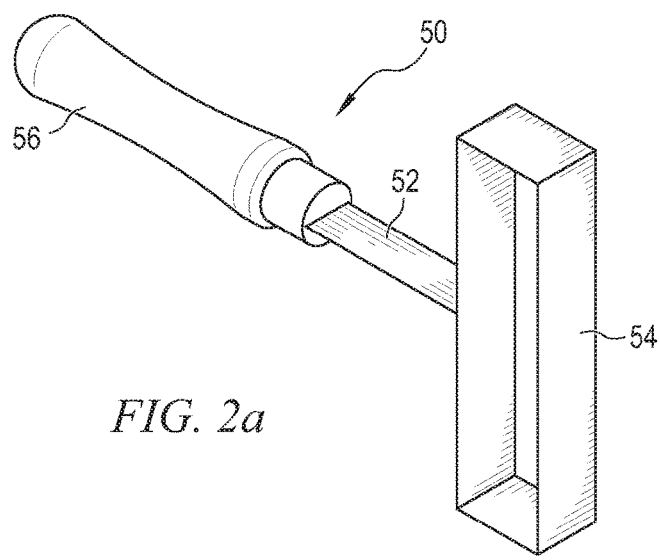
FIGS. 2a-2h illustrate forming a wall panel with sound absorbing material.

FIGS. 2a-2h illustrate inserting strips of sound absorbing material into a foam wall panel to improve the noise reduction qualities of a barrier wall formed with the panel. FIG. 2a illustrates an example of a blade 50 that is used to form channels in a foam wall panel for insertion of sound absorbing material strips. Blade 50 includes a neck 52, head 54, and handle or shank 56. Head 54 is rectangular to form channels in a foam wall panel that have a rectangular profile. Neck 52 and head 54 are sharpened to cut through a foam panel in the shape of blade 50. Head 54 is circuitous so that the portion of the foam panel that gets pulled through the rectangular portion becomes loose and can be removed.

Figure 2B:
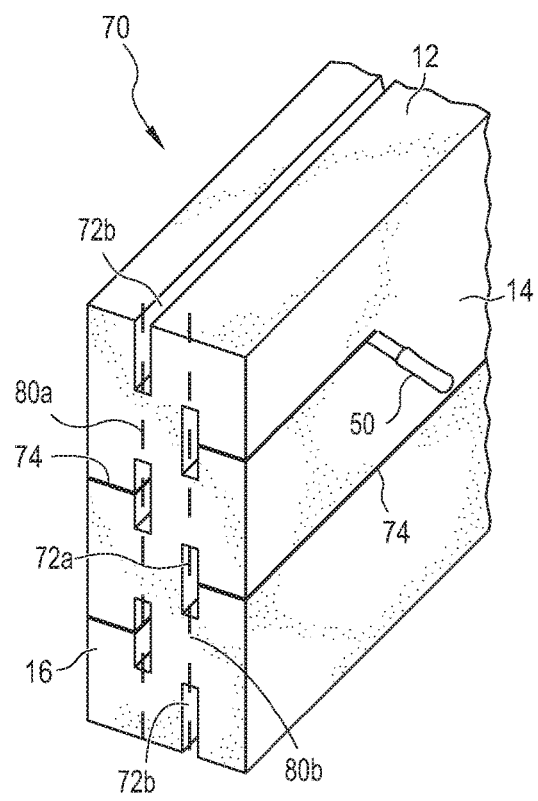

FIG. 2b illustrates wall panel 70 with channels 72 cut into the wall panel. Wall panel 70 begins as a foam wall panel similar to panel 10, and includes channels 72 formed using blade 50. FIG. 2b illustrates the top-right channel 72 in the process of being formed by blade 50. In one embodiment, wall panel 70 includes a height of two feet, a width of ten inches, a length of fourteen feet eleven inches, and an EPS density of 1.5 pounds per cubic foot. Blade 50 can be dragged through side surfaces 14 of panel 70 by hand to cut channels 72a. In another embodiment, multiple blades 50 can be attached to a surface, and then the panel 70 is moved over the surface to cut multiple channels at once. A frame with a height and width approximately matching panel 70, similar to frame 162 in FIG. 4b, is used in some embodiments to hold multiple blades and cut every channel 72 in a single motion. Blade 50 also cuts a slot 74 along the length of wall panel 70 as a byproduct of blade 50 including neck 52. Channels 72b in top and bottom surfaces 12 are cut using a blade configured differently, such that the neck of the tool does not cut through panel 70.

In the illustrated embodiment, each channel 72 includes a height of four inches and a width of one inch. Other embodiments use differently dimensioned channels. Two columns 80 of channels 72 are formed. Within each column, the four-inch channels 72 are spaced with centers eight inches apart so that there is four inches of space between adjacent channels within a column. The top of one channel 72 in one column 80 is aligned with the bottom of a channel in the other column. Each channel 72 is aligned with, and generally fits within, space between two channels of the opposite column 80. Every portion of the height dimension of wall panel 70 includes a channel 72 in at least one column 80.

With channels 72 that are four inches in height, and a panel 70 that is two feet in height, six channels are sufficient to fully cover the height of the block. Panels 70 of any appropriate dimensions can be used, as well as channels 72 of any appropriate dimensions. A panel with a larger height can be accommodated by using additional channels 72 in each column 80, by using larger channels 72, by allowing vertical space between channels 72, or by any combination thereof. In some embodiments, channels 72 in opposite columns overlap each other in the height dimension.

Figure 2C:
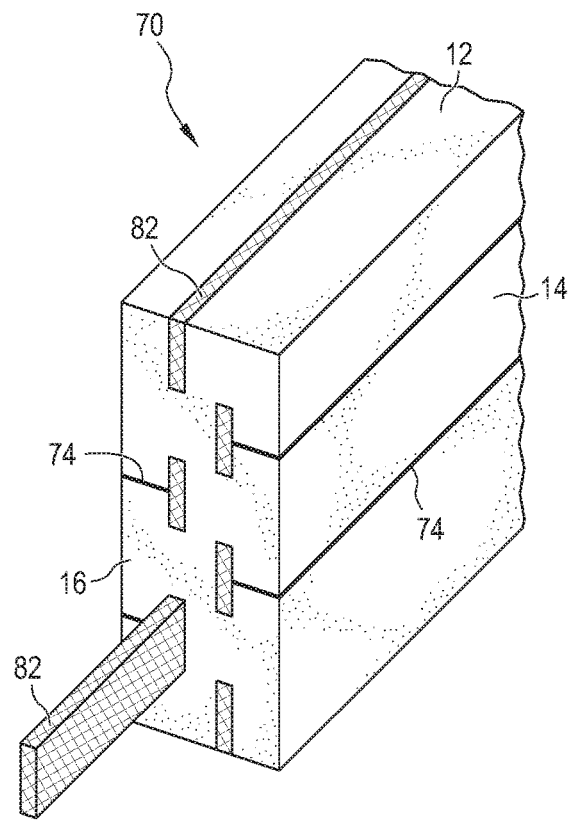

In FIG. 2c, sound absorbing strips 82 are disposed within channels 72. Sound absorbing strips 82 are a mineral or rock wool product, or other material with sound absorption or dampening properties. Sound absorbing strips 82 are slid into channels 72 from one end surface 16 to the other. Sound absorbing strips 82 are strips of material with a length approximately equal to a length of panel 70. In other embodiments, multiple shorter sound absorbing strips 82 are combined to fill each channel 72. Sound absorbing strips 82 can be slightly smaller than the height and width of channels 72 to allow the strips to slide relatively easily into the channels. Alternatively, sound absorbing strips 82 can be slightly larger than channels 72 for a press fit that helps secure the strips within panel 70.

Figure 2F:
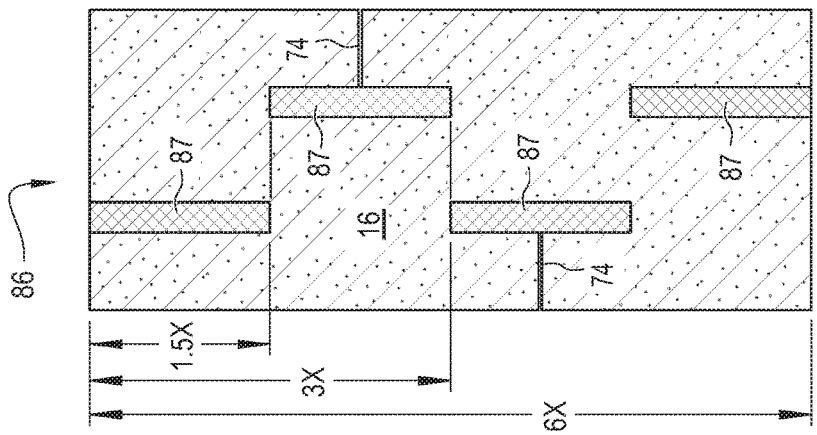
Figure 2E:
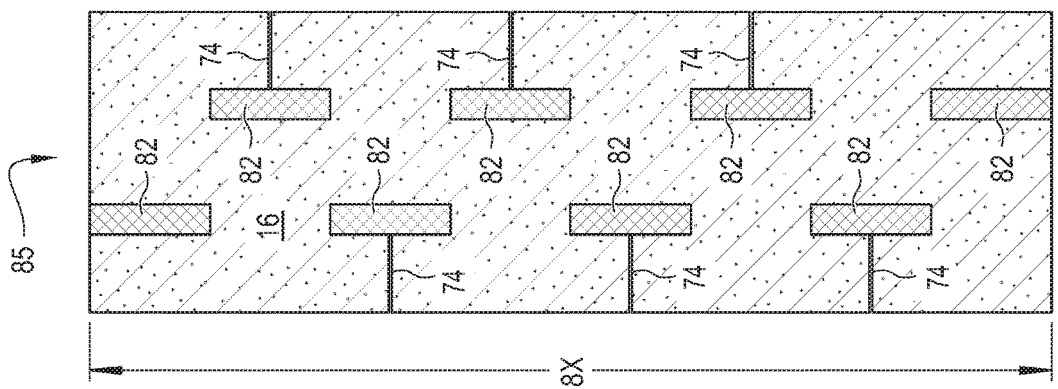
Figure 2D:
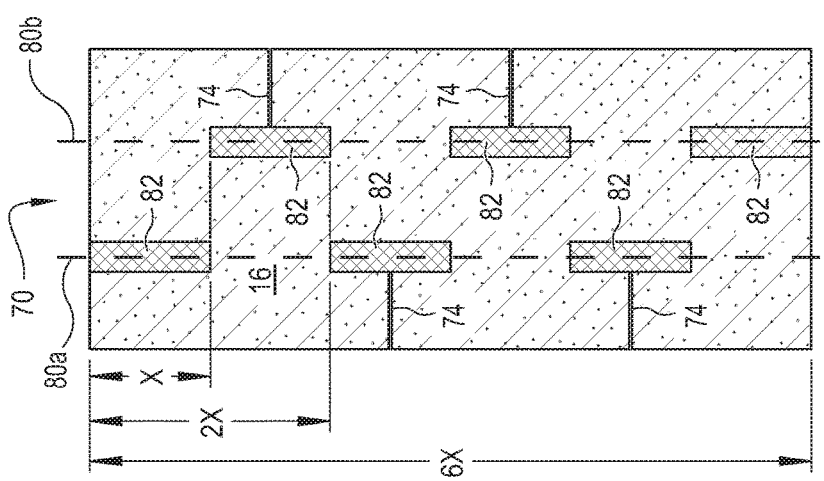

FIG. 2d illustrates detail of end surfaces 16 of block 70 with sound absorbing strips 82 in channels 72. Each column 80 includes four-inch tall sound absorbing strips 82 on eight-inch centers so that, in combination, sound absorbing material strips 82 in the two columns 80 fully cover the height of panel 70 with sound absorbing material. The scale of FIG. 2d shows that each sound absorbing strip 82 has a height of X. The first strip within column 80a begins at 0 and the second strip within column 80a begins at 2X. In one embodiment, X equals 4 inches. The height between the top two strips on column 80a is X, which aligns with the height of the top sound absorbing material strip 82 of the column 80b. The two columns 80 alternate so that sound absorbing strips 82 of one column 80 shares height with the space between two strips of the other column 80. Sound absorbing strips 82 can be taller to create an overlap, or shorter to leave some height of block 70 uncovered by sound absorbing material.

Any dimension and configuration of foam wall panels and sound absorbing strips can be used. For instance, FIG. 2e shows a taller foam block used as the base for a sound absorbing wall panel 85. The height of wall panel 85 is 8X, so eight sound absorbing strips 82 are used to cover the full height of the panel. FIG. 2f shows six-inch sound absorbing strips 82 can be used to make wall panel 86, and only four channels 72 are required instead of six as in FIG. 2d to cover the same height foam block. For a three-foot tall panel 70, nine of the four-inch sound absorbing strips 82, or six of the six-inch strips, can be used to fully cover the height of the panel.

Figure 2G:
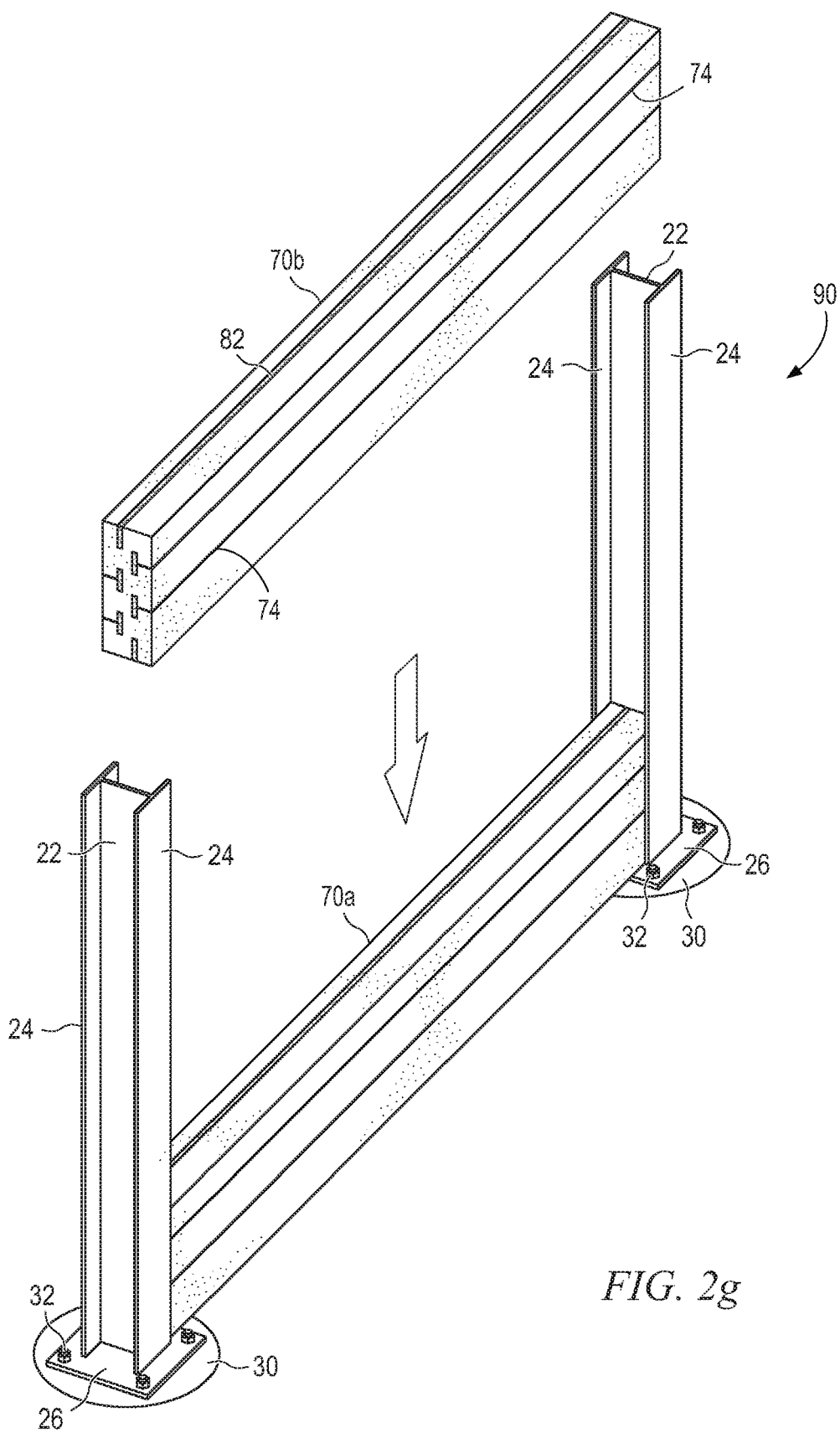

FIG. 2g illustrates forming a barrier wall 90 with sound absorbing wall panels 70. Any number of wall panels 70 are stacked to reach a desired height of barrier wall 90. Barrier wall 90 includes a wall of foam blocks 70 that are relatively light and easy to manufacture and install. Barrier wall 90 includes sound absorbing strips 82 that fully cover the height of the barrier wall to reduce noise from one side of the barrier wall reaching the other side.

Figure 2H:
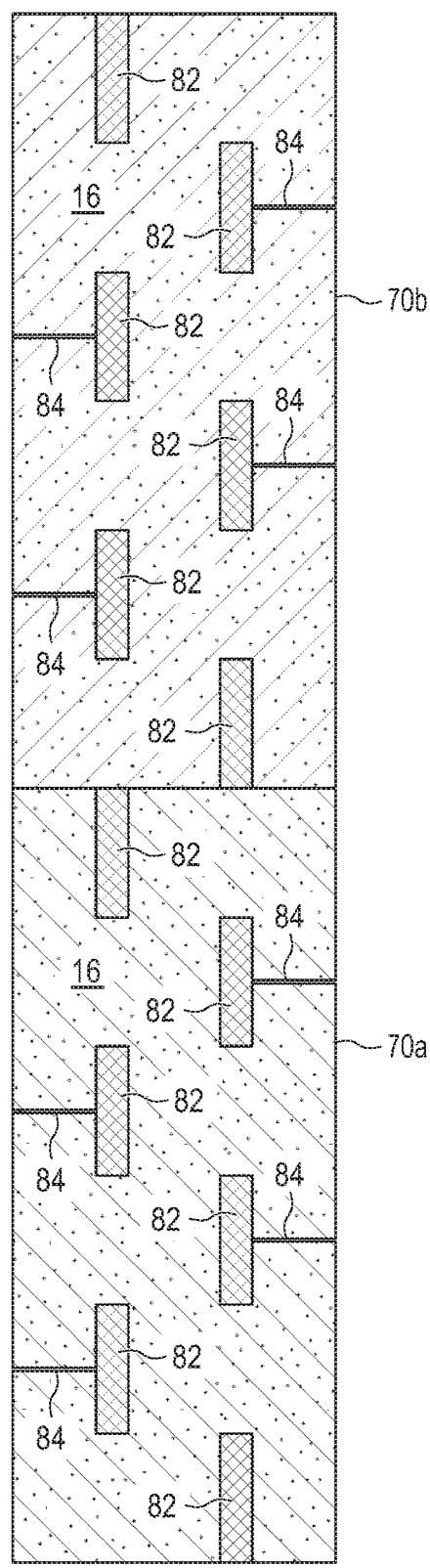

Because sound absorbing material strips 82 cover the full height of each constituent wall panel, the completed barrier wall 90 will have sound absorbing strips for the full height of the barrier wall. FIG. 2h illustrates two stacked wall panels 70a and 70b. No vertical space is provided between the top sound absorbing material strip 82 of wall panel 70a and the bottom sound absorbing material strip of wall panel 70b. Barrier wall 90 is a sound absorbing barrier wall that can be located between a source of noise, e.g., a traffic highway, and a location for desired tranquility, e.g., a residential neighborhood. Barrier wall 90 is used where sound absorption is a desirable property for a barrier wall, as sound absorbing strips 82 significantly reduce propagation of noise.

Figure 3B:
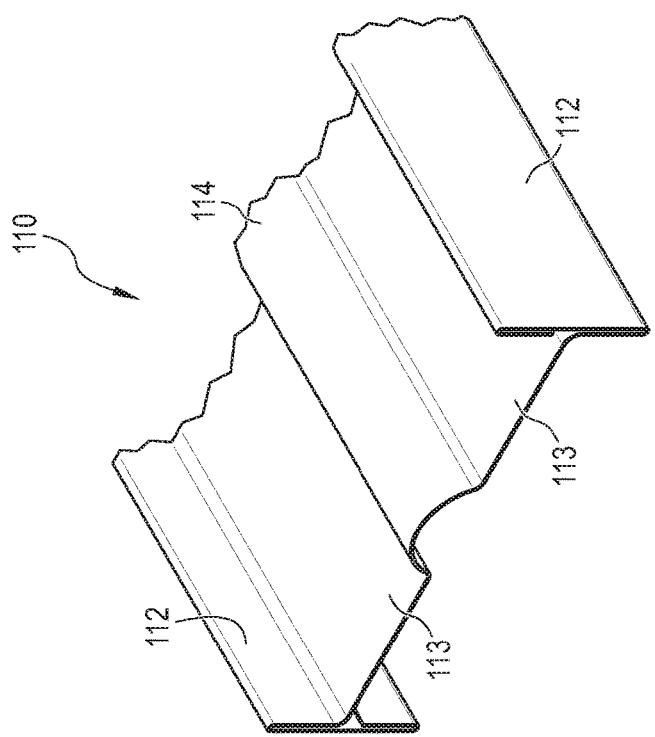
FIGS. 3a-3j illustrate forming a wall panel with a cable groove.
Figure 3A:
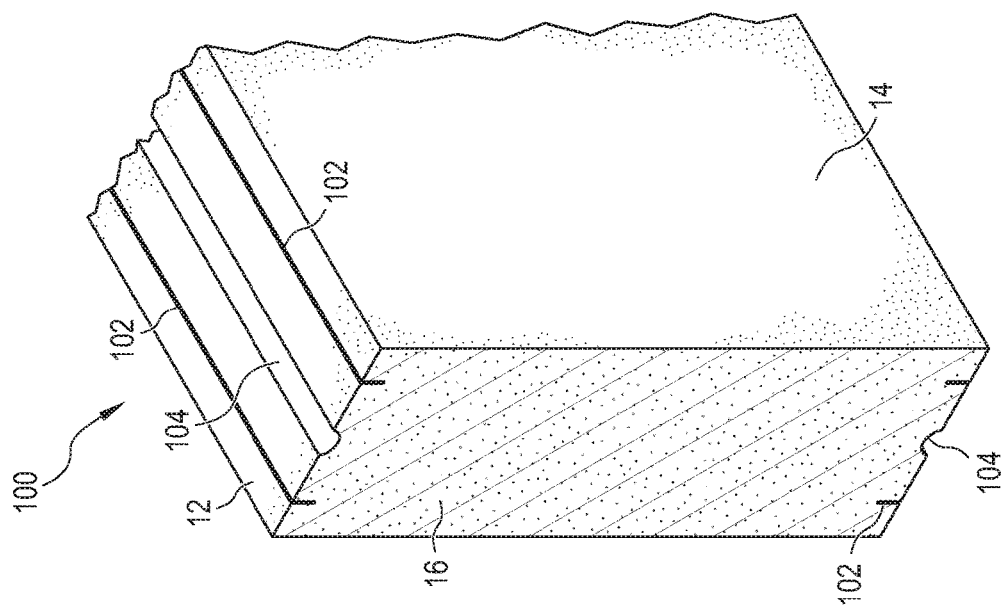

FIGS. 3a-3j illustrate forming a barrier wall with embedded safety cables. In FIG. 3a, grooves 102 and 104 are cut into top and bottom surfaces 12 of a foam block to form a wall panel 100. Grooves 102 and 104 are cut similarly to channels 72 in FIG. 2b. A blade with the desired shape for grooves 102 and 104 is slid along the length of top and bottom surfaces 12. Grooves 102 are configured to accommodate flanges of a horizontal I-beam that will be disposed between stacked panels 100. Grooves 104 are semicircular to accommodate a cable running between vertically stacked panels 100. In some embodiments, a portion of the foam material of panel 100 between grooves 102 and 104 is removed to provide extra space for a web of an I-beam inserted into the grooves.

FIG. 3b illustrates an I-beam 110 for use with panel 100. I-beam 110 includes a pair of flanges 112 and a web 113 extending between the flanges. Flanges 112 are spaced properly to fit within grooves 102 of panel 100. If grooves 102 are spaced six inches apart, then flanges 112 of I-beam 110 should be spaced approximately six inches apart from each other. Ridge 114 is formed along the center of web 113 between flanges 112. Ridge 114 is configured to fit into groove 104 to allow a cable to run through groove 104 without web 113 interfering. Ridge 114 routes web 113 along the bottom or top surface of a groove 104 so that the web does not cut directly across the center of a channel formed by two adjacent grooves 104.

Figure 3C:
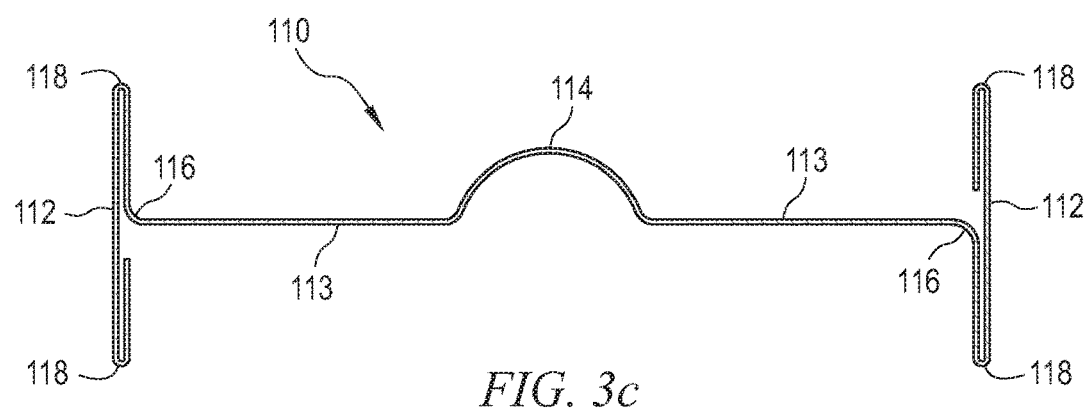
Figure 3D:
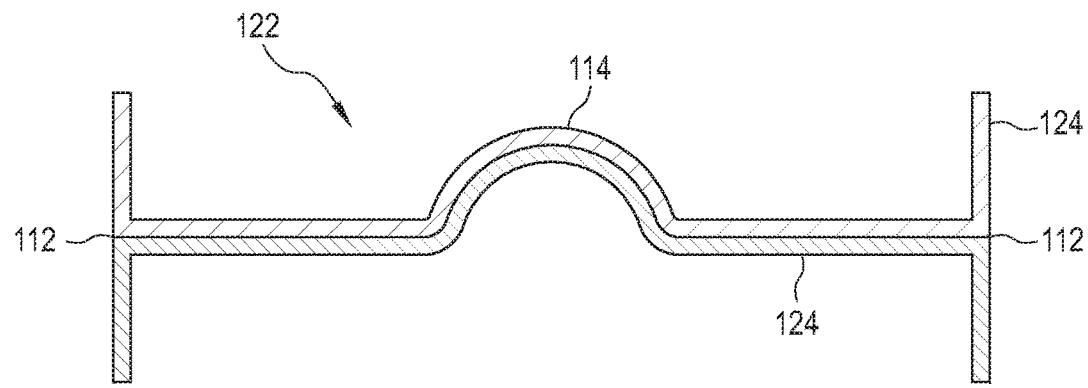
Figure 3E:
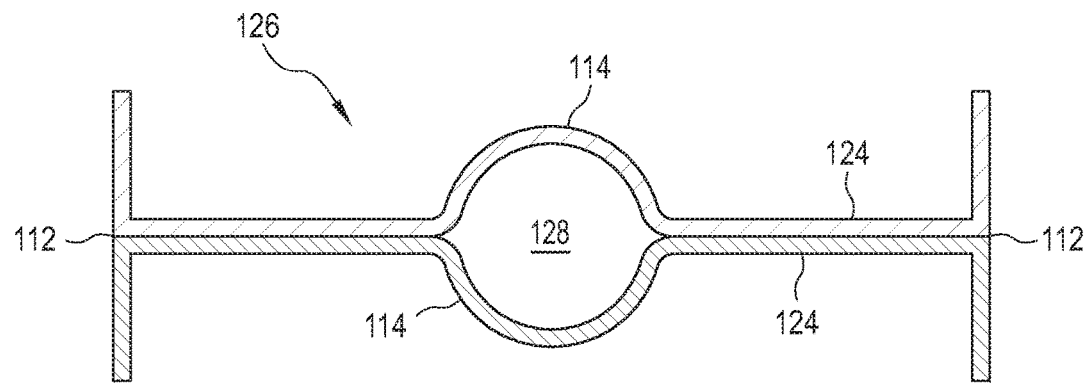

FIGS. 3c-3e illustrate detail of I-beams formed using three different manufacturing methods. FIG. 3c illustrates I-beam 110 formed from a single sheet of material. I-beam 110 is formed from a sheet of steel, galvanized steel, stainless steel, aluminum, a metal alloy, plastic, or other appropriate materials. In one embodiment, I-beam 110 is roll formed through a series of rollers that shape a flat sheet of material into the I-beam in FIG. 3c. Each roller in the series bends the sheet further toward the final I shape. Ridge 114 can be formed as part of the roll forming process, or can be stamped or die pressed into web 113 after roll forming I-beam 110.

FIG. 3d illustrates I-beam 122 formed from two track channels 124 placed back-to-back. Each individual track channel 124 is roll formed, extruded, or otherwise manufactured, and then two of the track channels are placed back-to-back. Track channels 124 can be placed back-to-back and mechanically attached to each other before or after cutting to length. Track channels 124 can be attached together by spot welding, rivets, adhesive, or another appropriate mechanism. Ridge 114 is pressed into I-beam 122 after track channels 124 are attached to each other. Alternatively, channels 124 can have ridges 114 formed prior to placing the channels back-to-back, as illustrated with I-beam 126 in FIG. 3e. Stamping ridges 114 in advance provides the opportunity for channels 124 to have ridges 116 extending in opposite directions for a fully enclosed groove or channel 128.

Figure 3F:
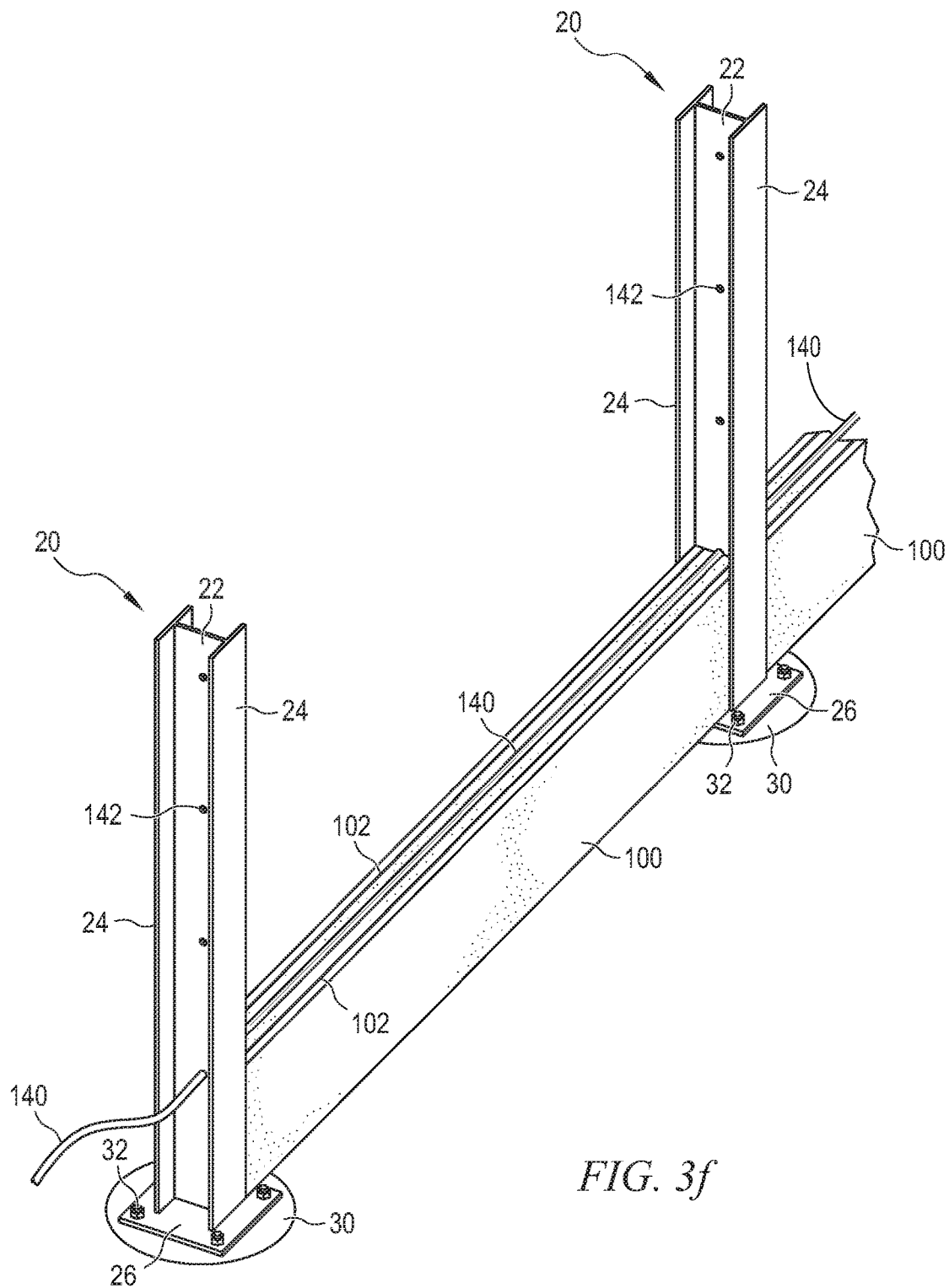
Figure 3G:
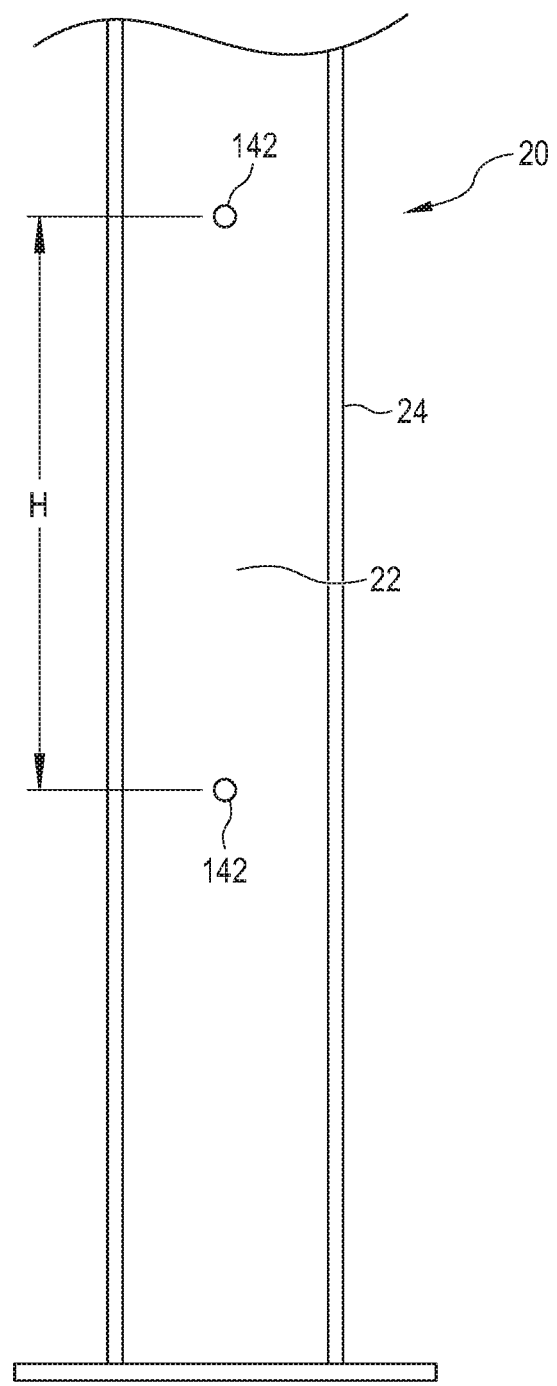

FIG. 3f illustrates an early stage of forming a barrier wall with I-beam 110 and a support cable 140. Vertical supports 20 include holes or openings 142 formed through web 22 of each of the supports to allow cable 140 to be threaded through the supports. FIG. 3g illustrates openings 142 formed every two feet along the height of web 22 to allow a cable 140 to extend along the length of panels 100 between every layer of two-foot panels. The distance between two openings 142 is approximately equal to the height of one panel 100 so that the openings 142 will line up with grooves 104 when constructing a barrier wall. In some embodiments, openings 142 are formed every foot, or even more densely, to provide added flexibility for grade changes or other circumstances. If a different height of wall panel is used, the distance between openings 142 should be modified accordingly.

Once panel 100a is set between supports 20, cable 140 is threaded through an opening 142 of an adjacent support 20 and set in groove 104. For a multi-section wall, a panel 100 can be set in each wall section, and then cable 140 is routed along the entire length of the barrier wall and through an opening 142 of each support 20. In FIG. 3f, cable 140 extends over two illustrated panels 100 and two pictured openings 142 of vertical supports 20. At least one additional vertical support 20, off the page of FIG. 3f, includes flanges 24 around the second panel 100 and an opening 142 that cable 140 extends through. Additional wall panels 100 and supports 20 are added serially to make a wall with any desired length. A single cable 140 is extended through openings 142 of each vertical support 20 and terminated at each end of the wall using a welded connection, a bolt threaded through web 22, or another appropriate means. In other embodiments, multiple cables are used to span the entire length of a wall rather than a single long cable.

Figure 3H:
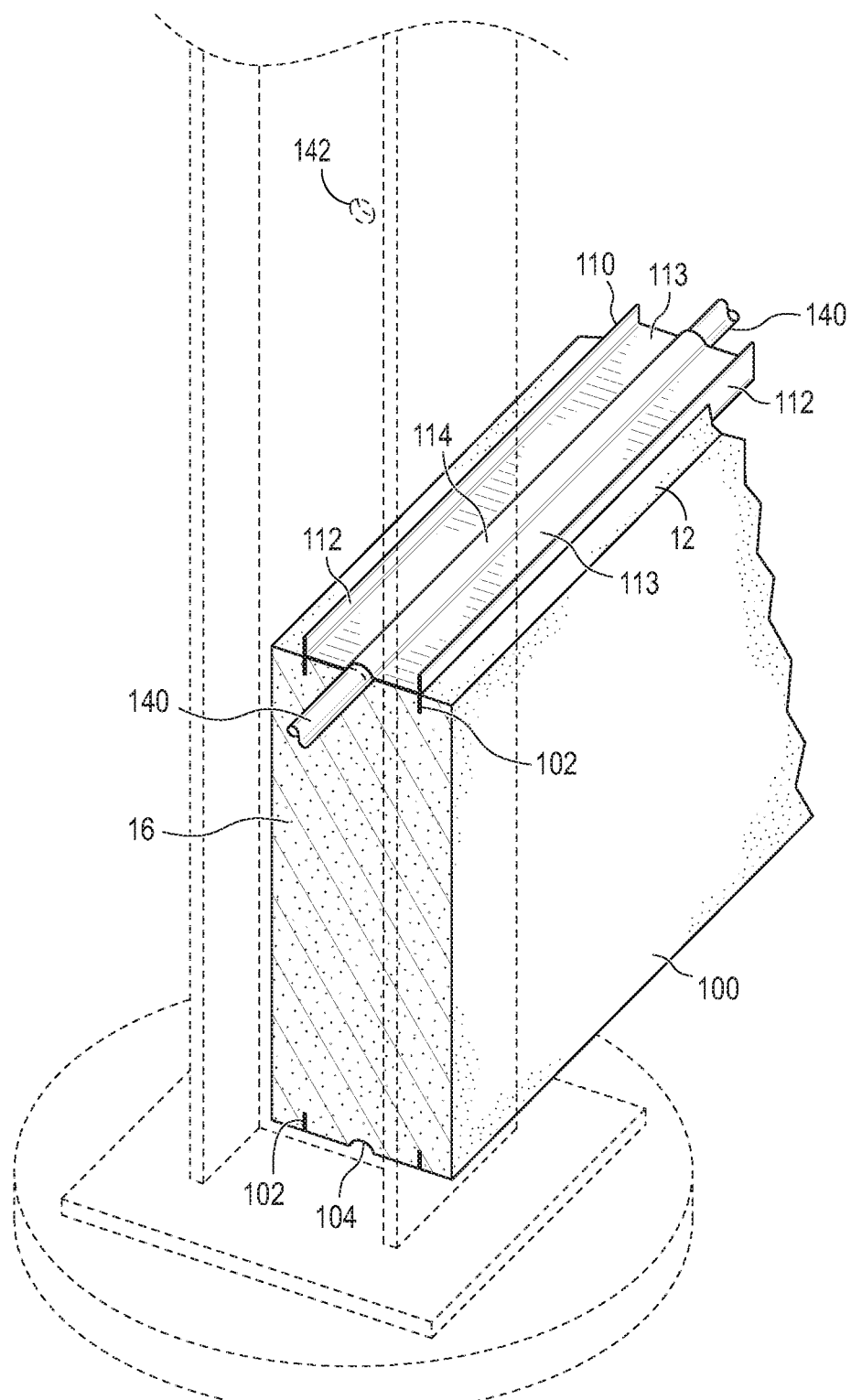

In FIG. 3h, I-beam 110 is disposed over panel 100 and cable 140. A separate I-beam 110 is disposed over each panel 100. I-beams 110 are approximately the same length as panels 100 and extend between flanges 24 along with the panels. In other embodiments, I-beams 110 are longer or shorter than the length of panels 100. I-beam 110 is longer than a wall panel in FIG. 7a below to allow attachment of a ground cable. Flanges 112 of I-beam 110 extend into the two grooves 102 in the top surface of panel 100. Web 113 extends between the two flanges 112 with ridge 114 of web 113 routing the web over cable 140. Web 113 generally lies flat on top surface 12 of panel 100 other than ridge 114. Flanges 112 and ridge 114 extend vertically above top surface 12. In another embodiment, I-beam 110 is inserted into grooves 102 and 104 prior to installing cable 140. Ridge 114 extends downward into groove 104 and cable 140 is disposed over I-beam 110 in ridge 114.

Figure 3I:
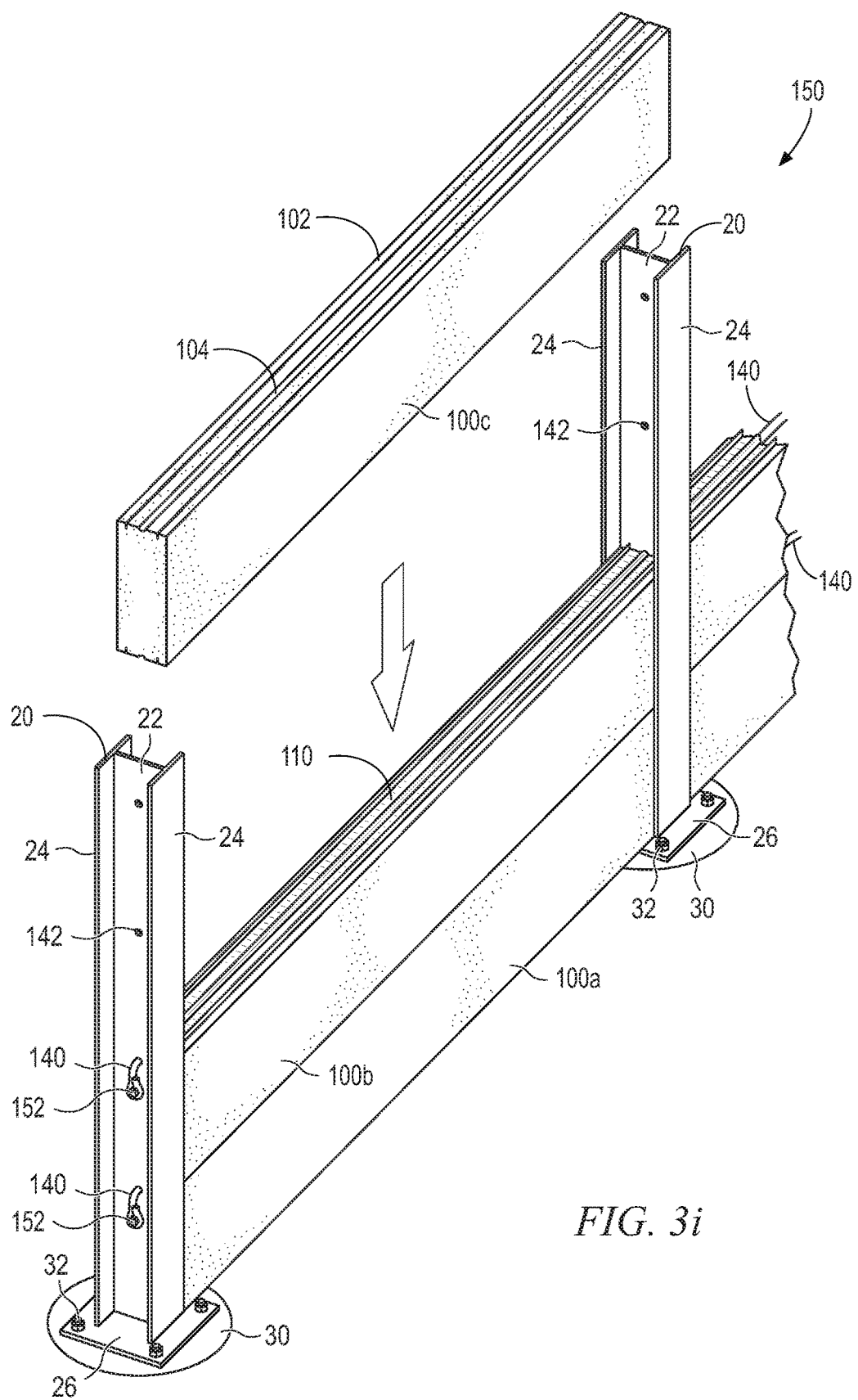

Blocks 100, cables 140, and I-beams 110, are successively stacked between a plurality of vertical supports 20 to form a wall 150 of any desired height. In FIG. 3i, two levels of panels 100 have already been stacked between supports 20, and a third is being formed. Wall panels 100a, 100b, and 100c are forming a first end section of wall 150. Cables 140 are seen terminated by bolts 152 at the end of wall 150. Cables 140 have a loop formed by welding the cable to itself, or by using a clamp or other mechanism to hold the cable in a loop. Bolts 152 are threaded through the loop of cable 140 and then attached to web 22 of vertical supports 20. Bolts 152 attach cable 140 to vertical supports 20 at each end of wall 150. In other embodiments, cables 140 are attached to supports 20 by welding or other appropriate means.

Figure 3J:
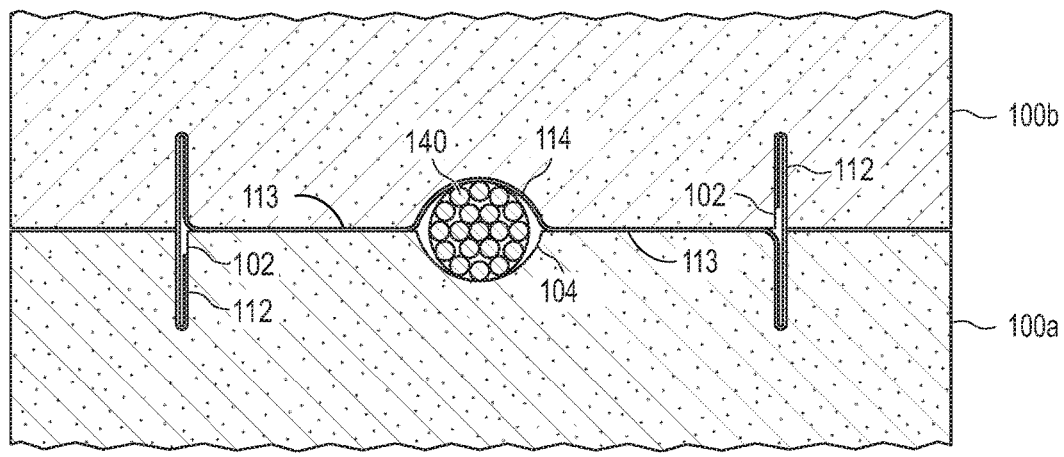

FIG. 3j illustrates a partial cross-section showing the interface between two vertically stacked wall panels 100a and 100b. Flanges 112 of I-beam 110 extend into grooves 102 of both panels 100a and 100b. Cable 140 lies in grooves 104 of both panels 100. Web 113 of I-beam 110 extends between the two flanges 112, and ridge 114 routes the web around cable 140 along the surface of one or both grooves 104. Cable 140 attaches panels 100 to vertical supports 20 through I-beam 110. In case of physical damage to barrier wall 150, cables 140 and I-beams 110 help keep panels 100 in place between vertical supports 20.

Figure 4A:
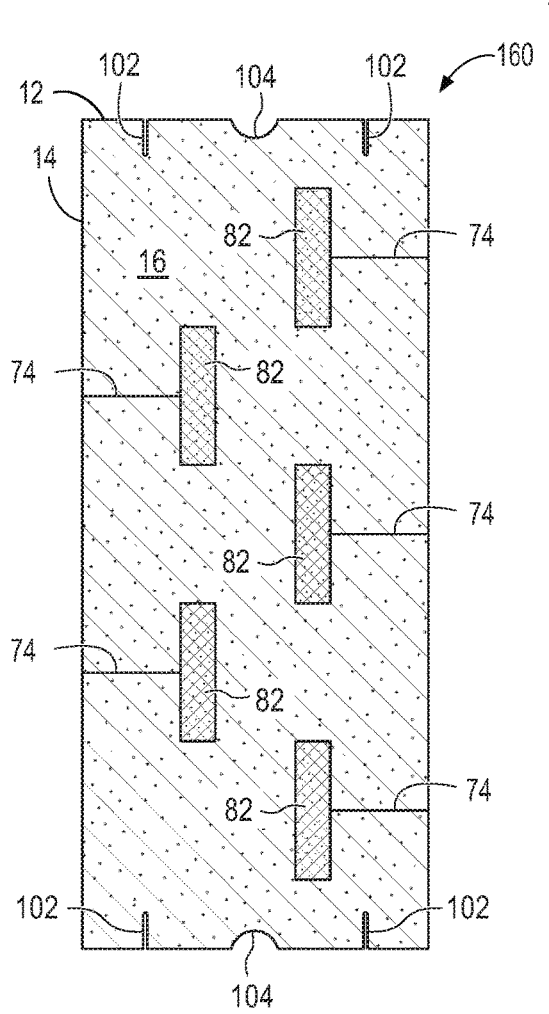
FIGS. 4a-4b illustrate a wall panel that combines the sound absorbing material and cable grooves.
Figure 4B:
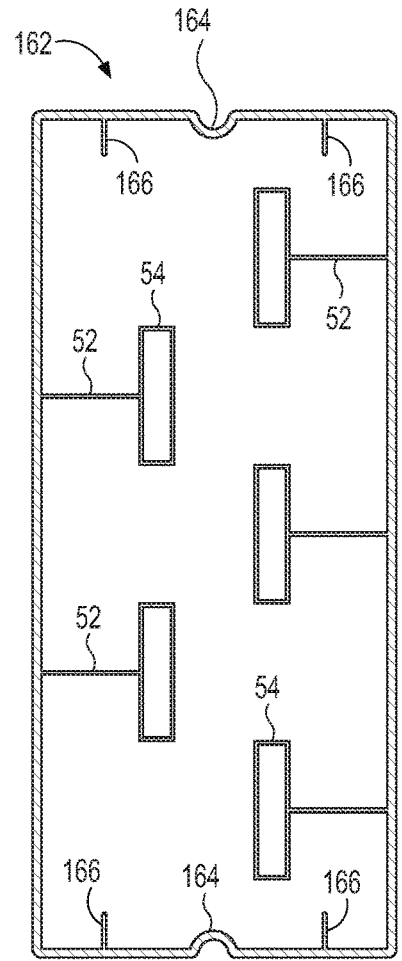

FIG. 4a illustrates a wall panel 160 that combines sound absorbing strips 82 from FIGS. 2a-2h with the I-beam 110 and cable 140 construction of FIGS. 3a-3j. Sound absorbing strips 82 in panel 160 do not completely cover the height of the base foam block, which allows room for grooves 102 and 104. In other embodiments, channels 74 are configured as in FIG. 2b, and sound absorbing material is exposed at surface 12 to fully cover the height of the wall panel. A wall is formed from panels 160 in a similar manner to wall 150 in FIG. 3i. A wall formed using panels 160 includes the sound reduction properties of wall panels 70 combined with the additional safety of wall panels 100.

FIG. 4b illustrates a frame 162 that can be used to form panel 160 from a block of foam. Frame 162 is approximately the same height and width as a foam block that forms the basis of panel 160. The foam block is slid through frame 162 to cut grooves 102, grooves 104, and channels 72 around the entire panel 160 in one motion. Frame 162 includes blades 52-54 from FIG. 2a mounted at locations where channels 72 are to be formed. Indentations 164 cut out grooves 104, and extensions 166 cut grooves 102. Blades 52-54, indentation 164, and extensions 166 are sharpened to cut through the base foam material as frame 162 slides along the block.

Figure 5A:
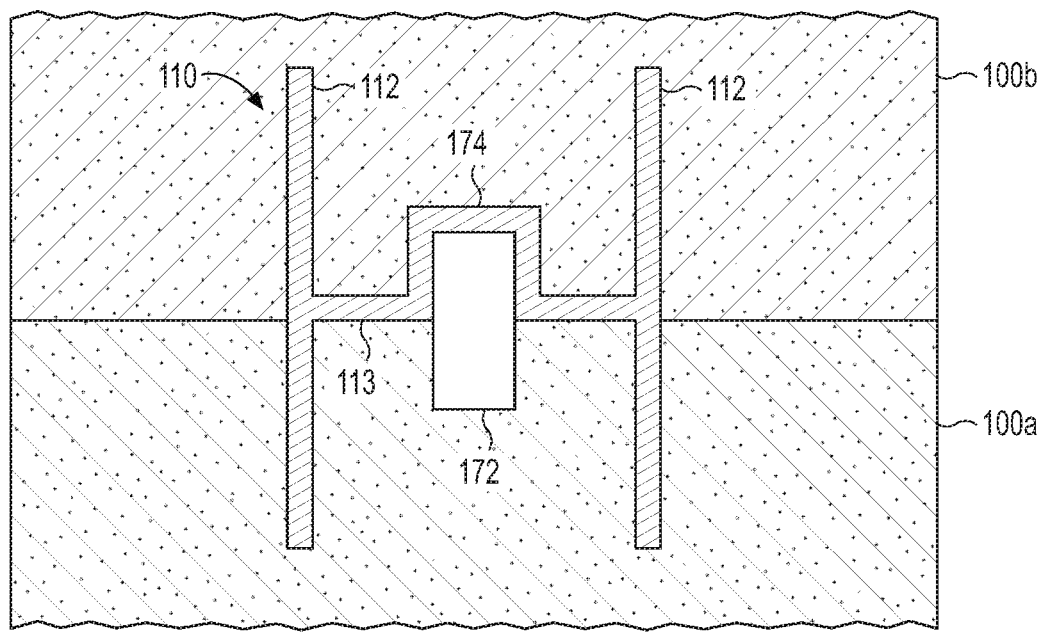
FIGS. 5a-5b illustrate alternative shapes for the cable groove.
Figure 5B:
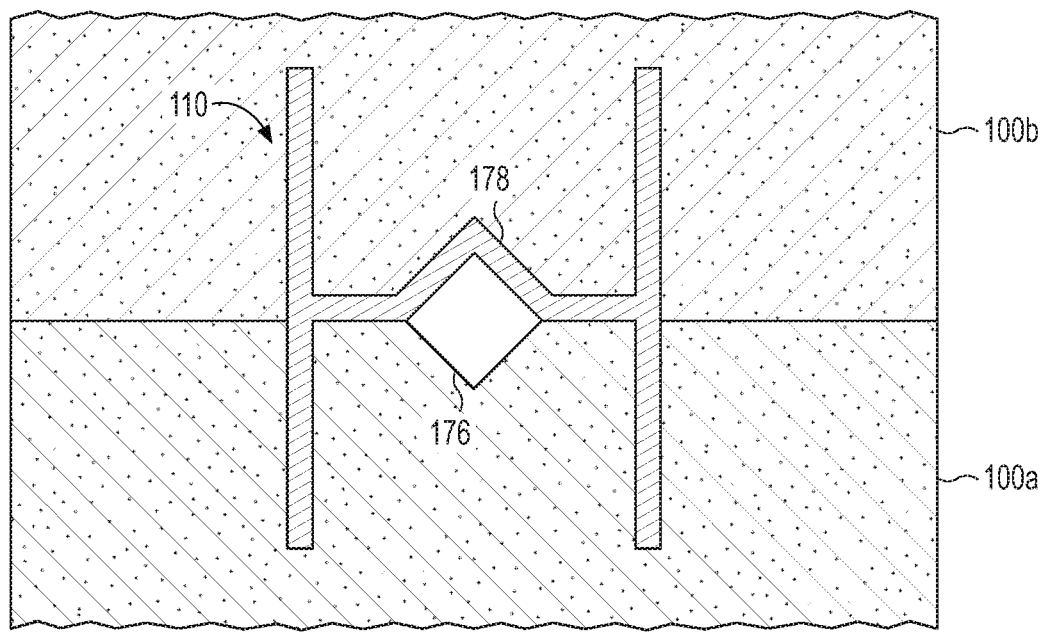

FIGS. 5a and 5b illustrate alternative shapes for the groove stamped into I-beams 110. In FIG. 5a, groove 172 is cut into a rectangular or square shape. Web 113 of I-beam 110 has a ridge 174 that is pressed or rolled into a corresponding square or rectangle shape. In FIG. 5b, grooves 176 and ridge 178 are formed into matching triangular shapes. In other embodiments, any appropriate shape can be used for grooves in blocks 100 and ridges in I-beams 110. I-beams 110 in FIGS. 5a and 5b can be formed in any appropriate method, e.g., those shown in FIGS. 3c and 3e, with the difference being the shape of a die press used to form ridge 174 or 178. Blocks 100a and 100b can have grooves 172 or 176 that are the same size in both blocks, with I-beam 110 fitting similarly within either of the grooves.

FIGS. 6a-6g illustrate building a barrier wall incorporating a concrete traffic barrier 200. In other embodiments, barrier 200 is formed from cast iron, steel, or other materials suitable for controlling traffic. Barrier 200 is generally pre-cast and then transported to a work site. Barrier 200 includes a main body 201 and a facade 202. The main body 201 of barrier 200 is a generally rectangular box. Facade 202 slopes in the shape of common traffic barrier, with the bottom thicker than the top. Facade 202 includes flanges 204 at both ends of the facade, which cause the facade to have a greater length than main body 201.

Main body 201 includes a ridge 208 formed on the top surface of the main body along substantially its entire length. Cable loops 210 extend from side surfaces of main body 201. Cable loops 210 are formed by embedding a cable into the concrete when forming barrier 200, with a portion of the cable extending out of the barrier to form a loop. In other embodiments, loops 210 are attached to traffic barrier 200 after the traffic barrier is formed.

Figure 6A:
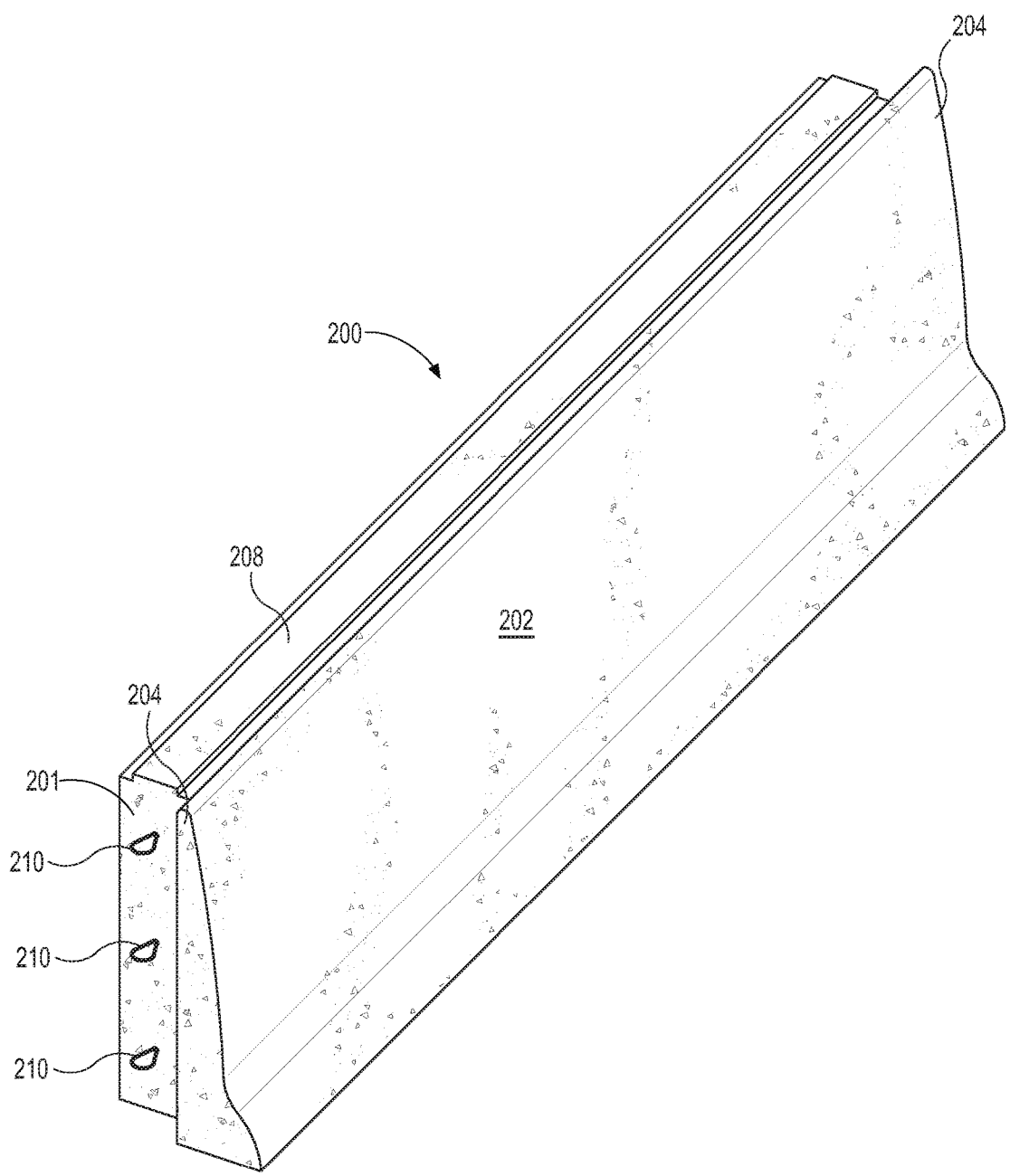
Figure 6C:
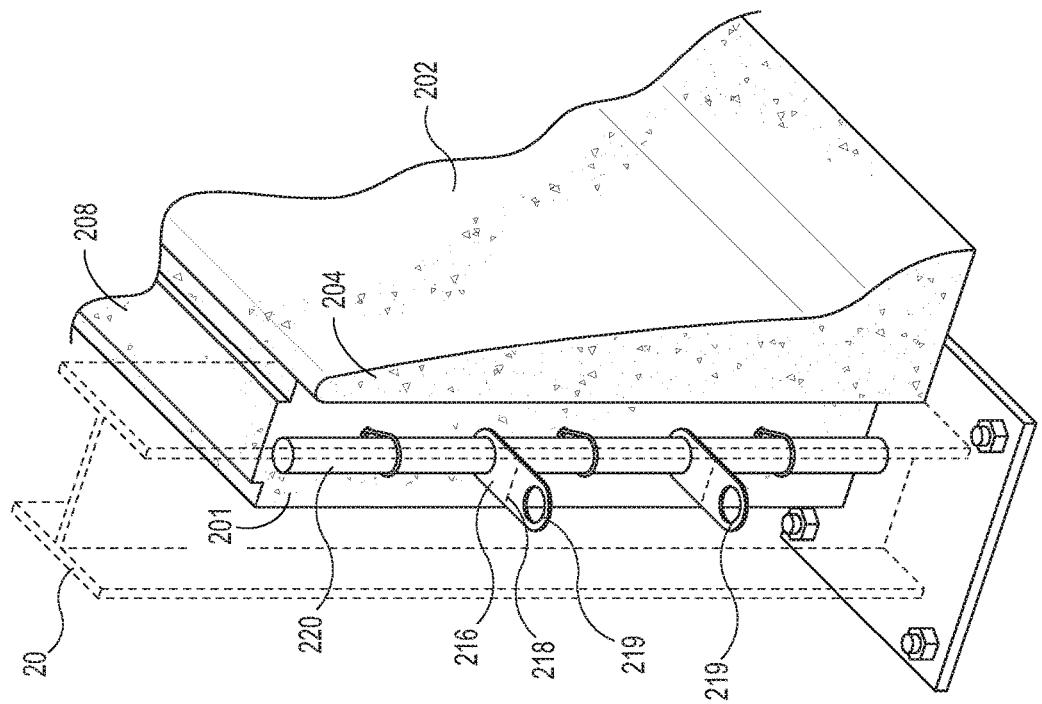
Figure 6B:
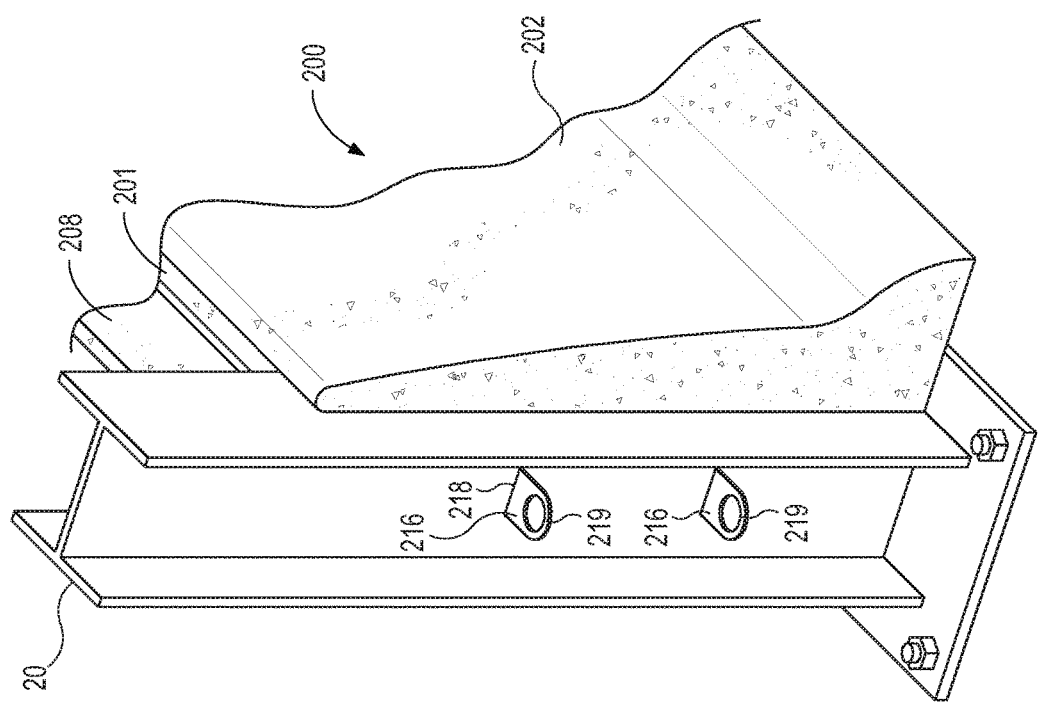

To make a barrier wall using traffic barrier 200, the traffic barrier is slid between two adjacent vertical supports 20 prior to stacking foam blocks over the traffic barrier. FIGS. 6b-6c illustrate detail of traffic barrier 200 between supports 20. The length of body 201 is short enough to fit between supports 20, while flanges 204 of facade 202 extend farther and do not fit between supports 20. Metal plates 216 are separate pieces and are inserted into slots 218 of supports 20.

FIG. 6c illustrates support 20 as transparent so that both ends of metal plates 216 are visible. Metal plates 216 include openings 219 at both ends of the metal plate. Metal plates 216 are inserted through slots 218, and openings 219 are aligned with loops 210 so that a rod 220 can be inserted through loops 210 and openings 219. Traffic barriers 200 are secured to each other, and to supports 20, by loops 210, rods 220, and metal plates 216. If another traffic barrier 200 is needed next to the traffic barrier pictured in FIGS. 6b-6c, the second barrier is inserted next to support 20 with the loops 210 of the new barrier aligned with the empty openings 219. A second rod 220 is inserted through the second openings 219 and the loops 210 of the second traffic barrier 200. If the pictured barrier is at the end of a wall, another rod 220 is inserted through openings 219 without another traffic barrier, as illustrated in FIG. 6d.

Figure 6D:
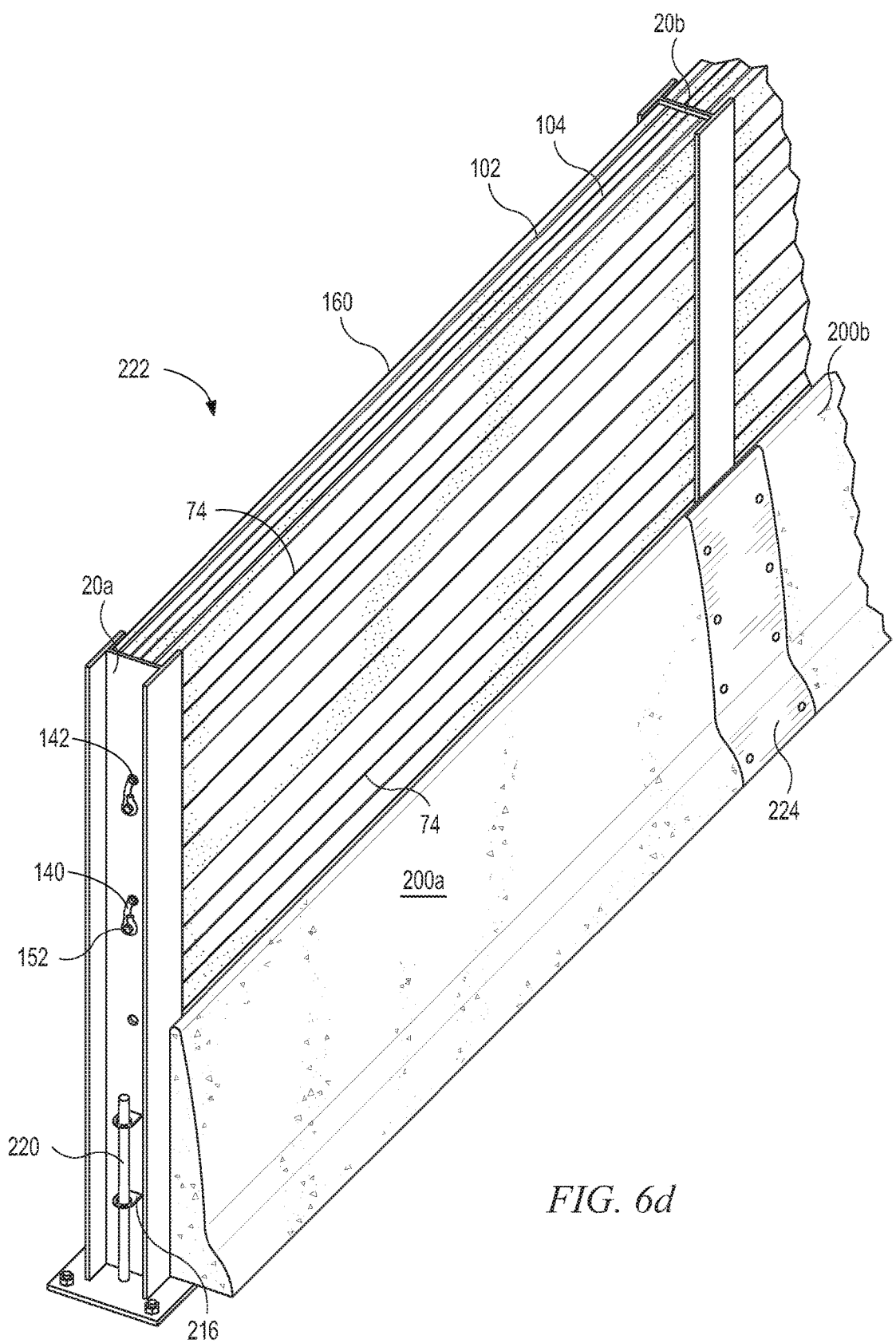

FIG. 6d illustrates a completed wall 222 with traffic barriers 200. Each adjacent pair of vertical supports 20 has a traffic barrier 200 disposed therebetween. Loops 210 of each end of each traffic barrier 200 are disposed between flanges 24 of a vertical support 20. The loops 210 at each end of each traffic barrier 200 have a rod 220 disposed through them. The rod 220 also extends through openings 219 of one or more metal plates 216.

Traffic barrier 200a and traffic barrier 200b share vertical support 20b. Barriers 200a and 200b both have loops 210 attached to a common metal plate 216 extending through vertical support 20b. A first rod 220 on the near side of vertical support 20b extends through opening 219 on one side of metal plate 216, and through loops 210 of traffic barrier 200a. A second rod 220 on the far side of vertical support 20b extends through openings 219 on the other side of metal plate 216, and through loops 210 of traffic barrier 200b. A metal sheet 224 covers the joint between traffic barriers 200a and 200b for durability and aesthetics. Sheet 224 is bolted into flanges 204 of both traffic barriers 200a and 200b. Sheet 224 is bent to follow the profile of facade 202.

Vertical support 20a marks one end of barrier wall 222. Traffic barrier 200a is the only traffic barrier that extends to vertical support 20a. Traffic barrier 200a is attached to vertical support 20a by having loops 210 of traffic barrier 200a looped around a rod 220 that also extends through the pictured plates 216. With no second traffic barrier 200 on the near side of vertical support 20a, the rod 220 on the near side of vertical support 20a is disposed through openings 219 of plate 216 opposite traffic barrier 200a, but is not disposed through any loops 210 of another traffic barrier. The rod 220 visible in FIG. 6d helps hold traffic barrier 200a between vertical supports 20a and 20b by holding plates 216 in slots 218 of support 20a.

To finish the wall sections, a plurality of foam panels 160 from FIG. 4a are stacked over each traffic barrier 200. In other embodiments, other disclosed foam blocks are used rather than panels 160, e.g., panels 10, panels 70, or panels 100. In one embodiment, traffic barrier 200 is four feet tall, and each panel 160 is two feet tall. Using one traffic barrier 200 and three panels 160, as in FIG. 6d, results in a ten-foot-tall barrier wall 222. Barrier wall 222 includes a traffic barrier 200 at the foot of each wall section, which helps contain traffic to the roadway. Traffic barriers 200 are sufficient to stop vehicles under most normal circumstances. Barrier wall 222 also includes sound absorbing strips 82 within panels 160 to reduce road noise from reaching surrounding neighborhoods. Barrier wall 222 includes an I-beam 110 and cable 140 extending between each pair of vertically stacked panels 160. I-beams 110 and cable 140 help keep panels 160 attached to supports 20 so the panels are less likely to break loose and cause a hazard. Barrier wall 222 can extend for any desired length depending on the length of roadway or area to be protected from the roadway.

FIGS. 6e-6g illustrate options for the interface between traffic barriers 200 and a foam panel placed on the traffic barriers. In FIG. 6e, a foam block 230 includes grooves 102, similar to panels 100 and 160. In some embodiments, foam block 230 includes a groove 104 so that the same I-beams 110 can be used from other embodiments, and a cable 140 may be used between panel 230 and barrier 200 if desired. Grooves 102 accommodate one side of flanges of I-beam 232. The second side of the I-beam 232 flanges fit around ridge 208 of traffic barrier 200. A bottom of panel 230 terminates at the web of I-beam 232, and leaves a gap 234 between traffic barrier 200 and panel 230.

Ridge 208 juts up rather than down in order to avoid creating a crevice where the traffic barrier and wall panels meet. Ridge 208 extending upward reduces water collecting on the top of traffic barrier 200. In some embodiments, facade 202 is not used. Facade 202 being taller than body 201 creates a crevice 236 that may also collect water. Having ridge 208 extending upward, and having no facade 202 extending above body 201, results in a traffic barrier 200 without crevices on the top of the traffic barrier that collect significant amounts of water.

FIG. 6f illustrates a panel 240 with a cutout 242 that fully accommodates I-beam 232. The full depth of cutout 242 is approximately equal to the height of the flange of I-beam 232, so that the bottom of panel 240 terminates approximately at the bottom end of the flanges. Panel 240 fills gap 234 to substantially remove any visible gap between traffic barrier 200 and panel 240. FIG. 6g illustrates panel 250 with a cutout 252. Cutout 252 accommodates ridge 208 without the added extensions for flanges of an I-beam. Panel 250 is set directly on traffic barrier 200 without using an I-beam between the two.

Figure 7A:
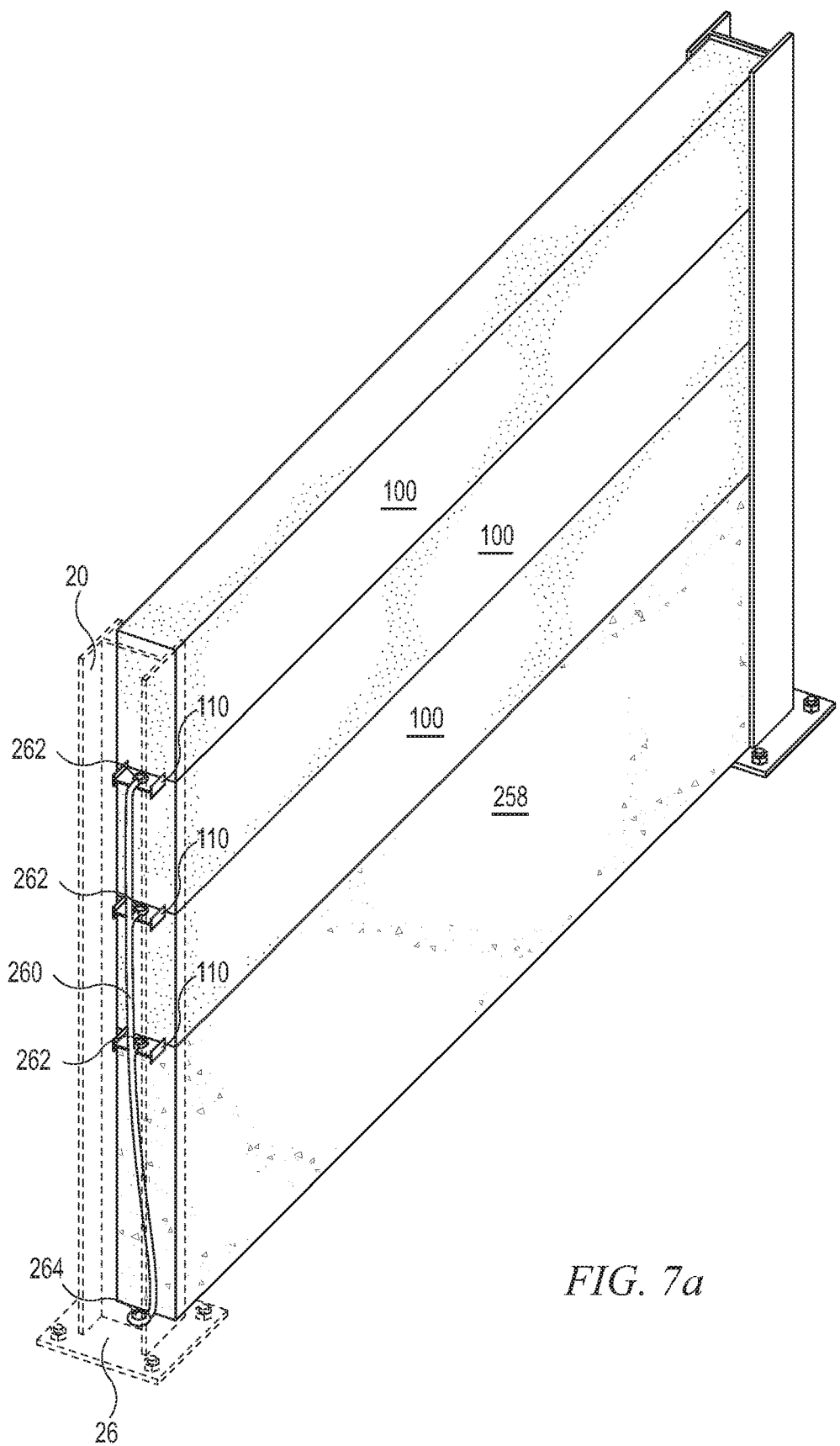
FIGS. 7a-7b illustrate alternative traffic barrier embodiments.

FIG. 7a illustrates a barrier wall 256 showing optional features of barrier walls. Traffic barrier 258 is provided having no facade 202 extending from a side surface of the traffic barrier. Barrier 258 can be slightly longer than the distance between the ends of flanges 24. To insert traffic barrier 258 between vertical supports 20, one end of the traffic barrier is inserted between flanges 24 of one of the vertical supports, then straightened out to extend toward the other vertical support. Traffic barrier 258 is then slid toward the second vertical support 20 to extend slightly between the flanges of each vertical support. In some embodiments, traffic barrier 258 retains loops 210 to attach to supports 20 and adjacent traffic barriers through plates 216 and rods 220.

FIG. 7a also illustrates an electrical grounding option using cable 260. Cable 260 is attached to each horizontal I-beam 110 using a bolt 262. In other embodiments, a rivet, welding, or another appropriate mechanism is used. Cable 260 is attached to each I-beam 110 between each layer of barrier wall 256, and then attached to baseplate 26 of vertical support 20 using a grounding bolt 264. In some embodiments, bolts 262 attach cable 260 to I-beams 110 off-center to allow room for groove 104 and cables 140 between panels. Grounding cable 260 can be attached in any barrier wall embodiment that utilizes I-beams between layers. Cable 260 is routed around rod 220, loops 210, and plates 216.

Figure 1A:
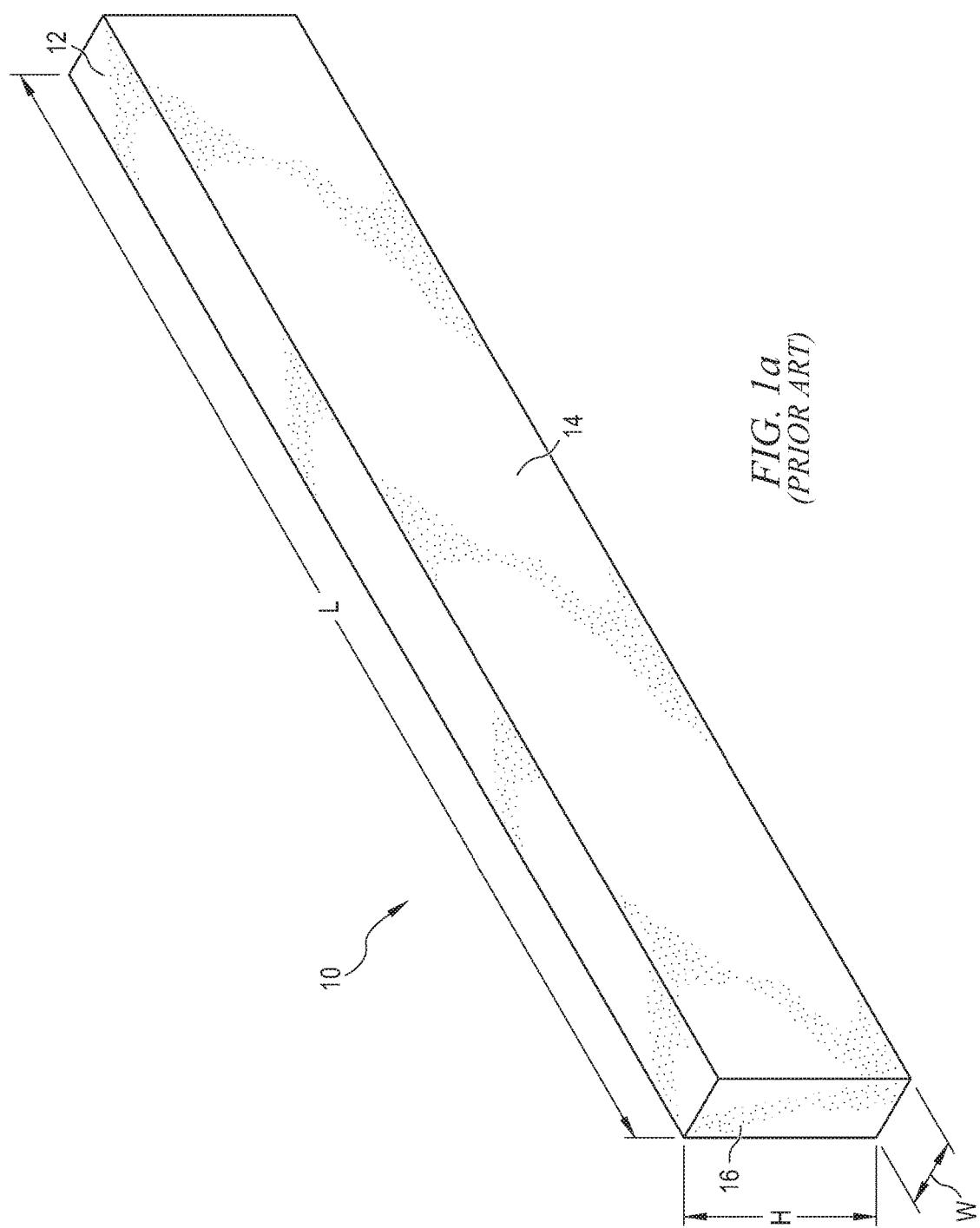
FIGS. 1a-1b illustrate a prior art wall panel and barrier wall.
Figure 1B:
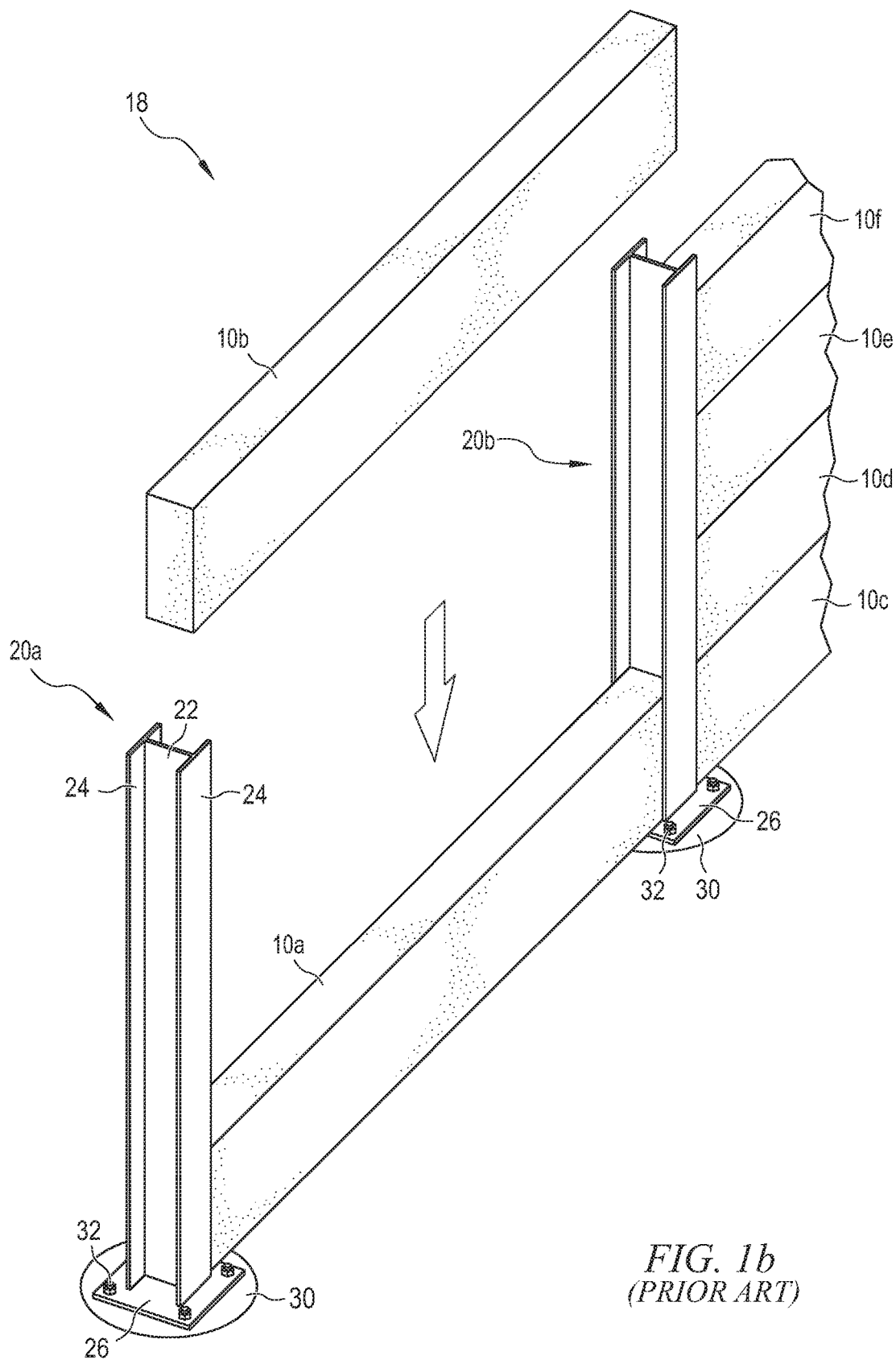
Figure 7B:
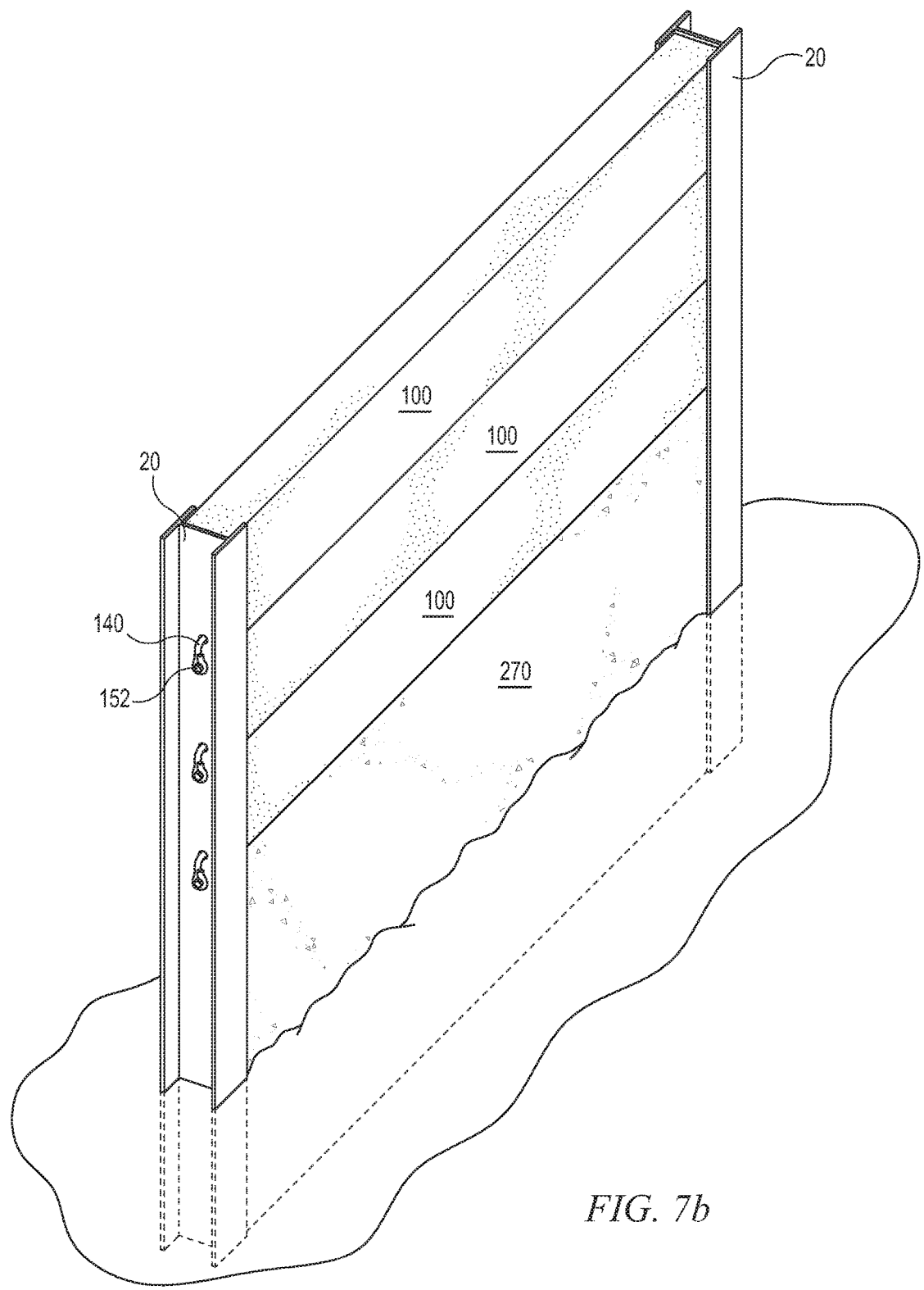

FIG. 7b illustrates another option for barrier walls formed with foam panels. Traffic barrier 270 includes extra height, with the extra height buried below ground level. In the illustrated embodiment, traffic barrier 270 extends three feet below grade while remaining four feet above grade, for a total height of seven feet. Vertical supports 20 extend three feet underground along with traffic barrier 270. In some embodiments, baseplates 26 and footings 30 are disposed three feet underground, but otherwise resemble the baseplate and footings of FIG. 1b. Cable 260 is used along with traffic barrier 270 in some embodiments. Traffic barrier 270 extending into the ground can be used with any of the previously disclosed wall panels to improve structural integrity. Traffic barrier 270 is especially useful when a barrier wall is being formed to protect critical infrastructure. The extent of traffic barrier 270 into the ground increases protection against vehicles intentionally driven into the traffic barrier, which will likely hit with more force than an accidental impact.

Figure 8A:
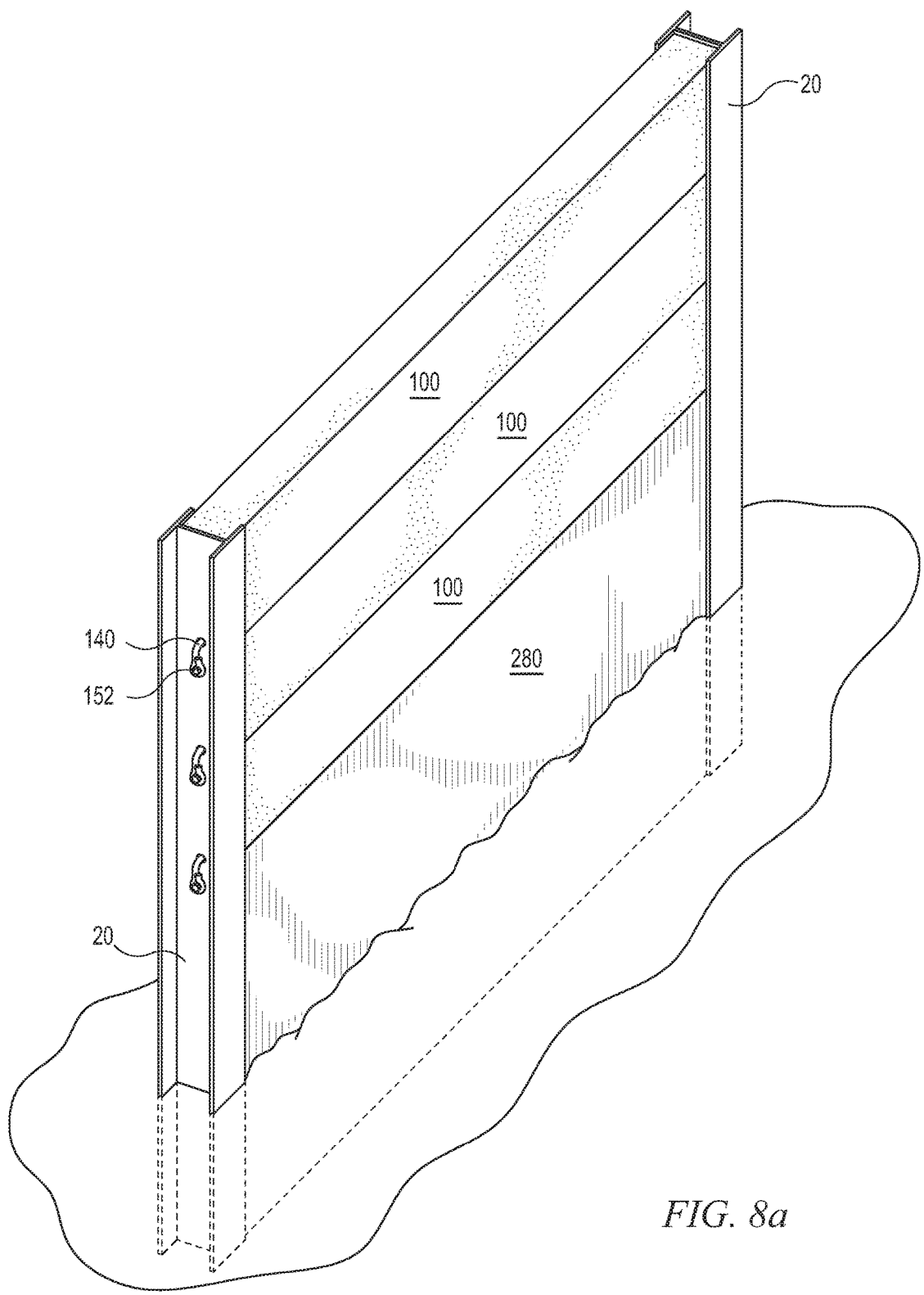
FIGS. 8a-8c illustrate a Faraday shield disposed over a barrier wall.
Figure 8B:
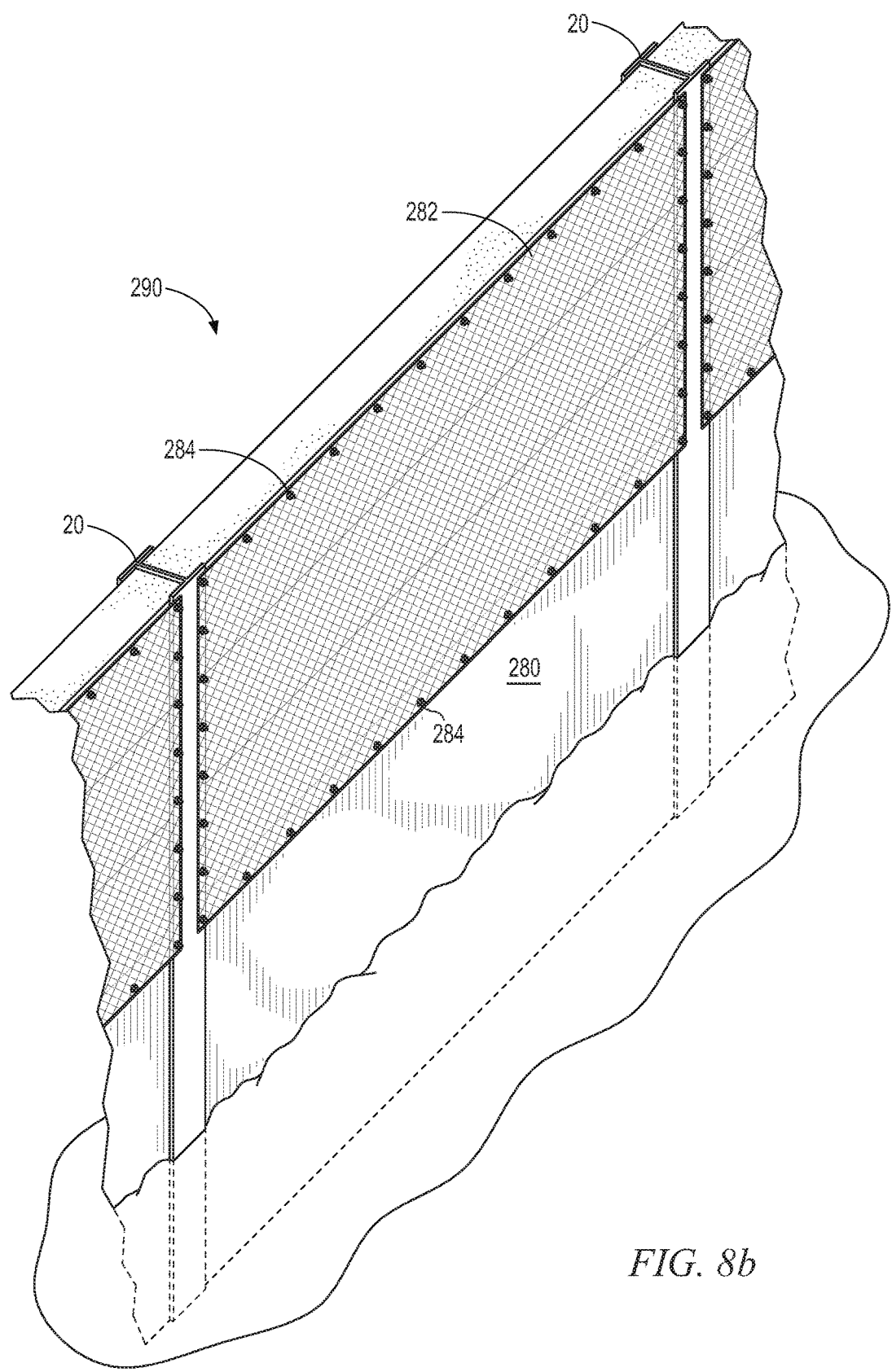

FIG. 8a illustrates a traffic barrier 280 formed from steel, iron, or another metallic material. Because traffic barrier 280 is electrically conductive, the underground surface area increases electrical grounding as well as physical resilience. Electrical grounding can be further enhanced by adding a Faraday cage or shield 282 as shown in FIG. 8b. Faraday shield 282 is attached onto traffic barrier 280 and vertical supports 20 using bolts 284, welding, or another suitable means. Both vertical supports 20 and barrier 280 are electrically conductive and embedded in the ground, which gives Faraday shield 282 a good electrical connection to Earth. Faraday shield 282 is an electrically conductive mesh or solid sheet that limits electromagnetic radiation through barrier wall 290. In other embodiments, Faraday shield 282 can be an electrically conductive paint applied over the barrier wall.

Barrier wall 290 includes a full covering of electrically conductive and grounded material. Barrier wall 290 can be built around electrical infrastructure, such as power plants or substations, to block generated electromagnetic radiation from surrounding areas. Panels 70 or 160 with sound absorbing strips 82 can be used along with Faraday shield 282 and metal traffic barrier 280 to effectively block both electromagnetic radiation and sound from the enclosed equipment. Faraday shield 282 and traffic barrier 280 can also use blocks 160.

Figure 8C:
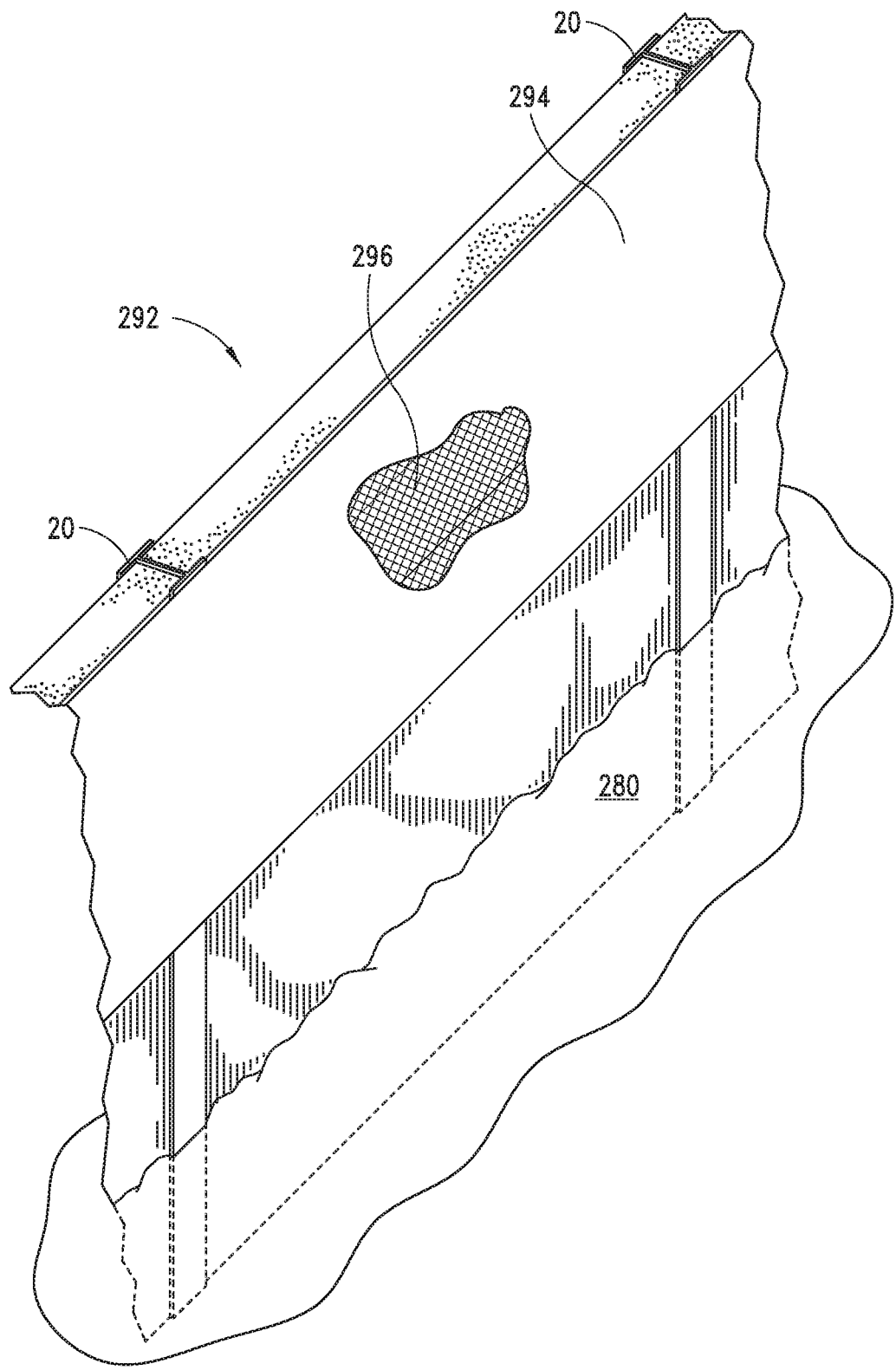

FIG. 8c illustrates a barrier wall section 292 with stucco covering 294. Stucco covering 294 includes a Faraday shield 296 embedded in the stucco covering. Faraday shield 296 is embedded between layers of stucco covering 294 such that the stucco covering 294 provides electrical isolation for the Faraday shield. An opening is illustrated in stucco covering 294 to show Faraday shield 296, but the Faraday shield would be completely covered by stucco in most embodiments. Faraday shield 296 is not electrically connected to ground through either of pillars 20 or traffic barrier 280. A layer of stucco covering 294 is disposed between Faraday shield 296 and the metal components of the barrier wall to provide electrical isolation. Having Faraday shield 296 electrically isolated rather than connected to ground is desirable in some embodiments. Stucco covering 294 and Faraday shield 296 can extend all the way to the ground if desired.

Figure 9A:
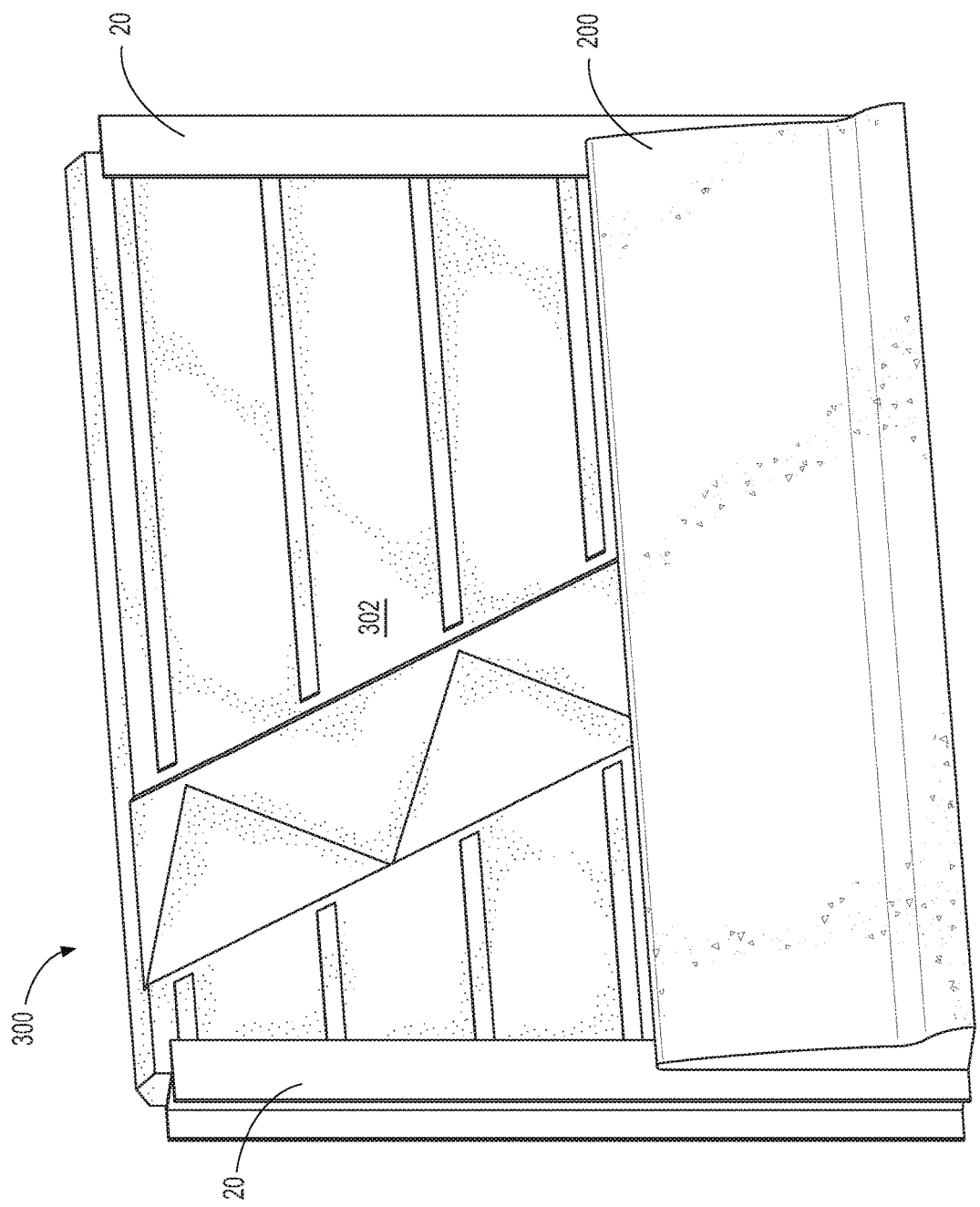
FIGS. 9a-9b illustrate a completed barrier wall section, and mitigating traffic noise with the barrier wall.

FIG. 9a illustrates a barrier wall section 300 with a stucco covering 302 formed over the underlying wall panels. Covering 302 is formed using other appropriate covering materials in other embodiments. Covering 302 can be patterned and colored as desired to enhance the appearance of barrier wall section 300. Covering 302 is applied over any of the previously discussed wall panels, and can be applied over Faraday shield 282. In some embodiments, covering 302 extends over traffic barrier 200 with or without facade 202.

Figure 9B:
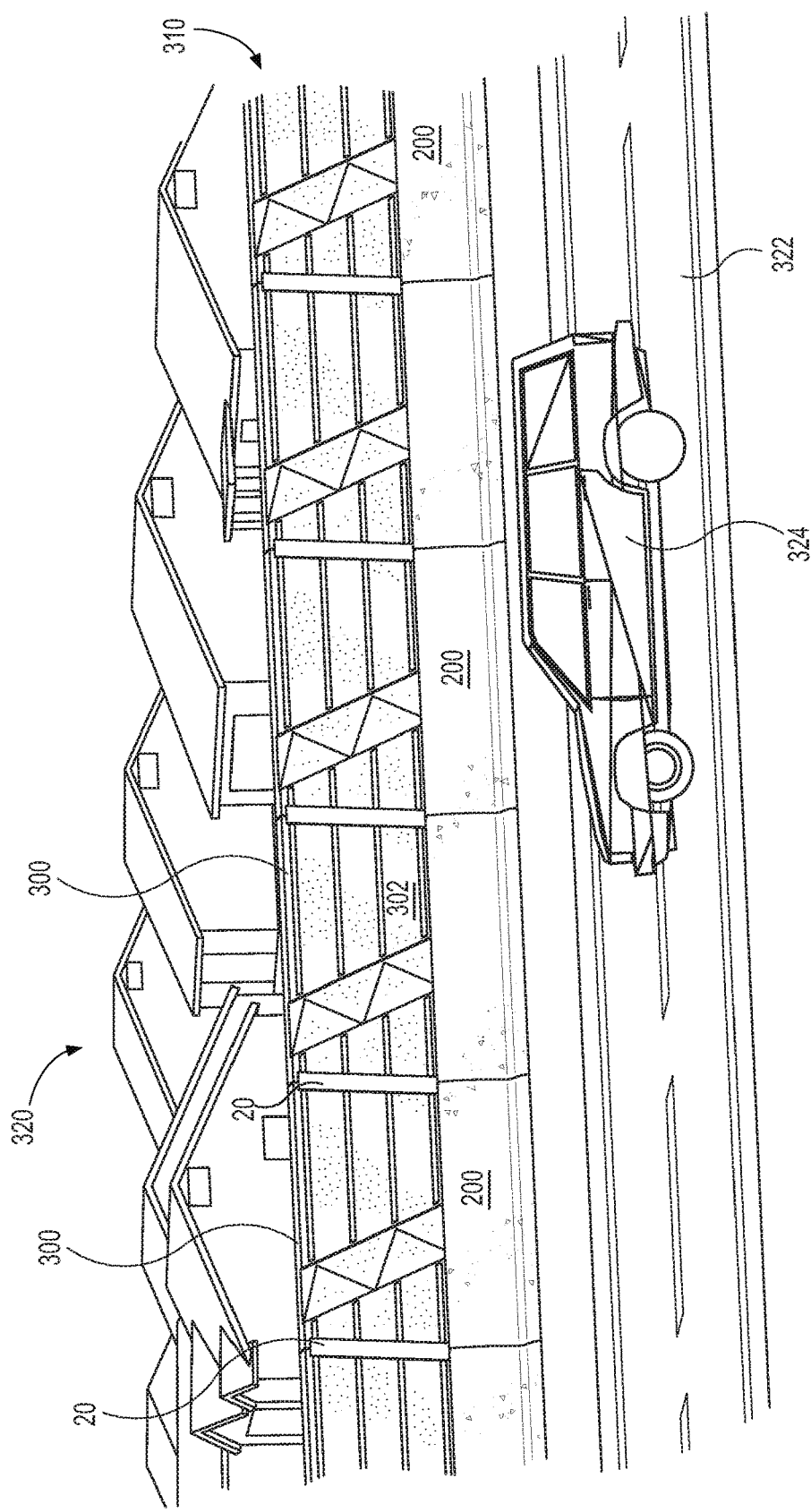

FIG. 9b illustrates a barrier wall 310 formed from a plurality of sections 300. Barrier wall 310 is formed between a neighborhood 320 and a roadway 322. Roadway 322 includes cars and trucks 324 driving along at all hours of the day and night, which can be noisy. Barrier wall 310 includes sound absorbing strips 82 and effectively reduces noise from roadway 322 so that neighborhood 320 is not significantly bothered by the presence of the nearby roadway. In some embodiments, covering 302 extends over and covers vertical supports 20, traffic barrier 200, or both.

Figure 10A:
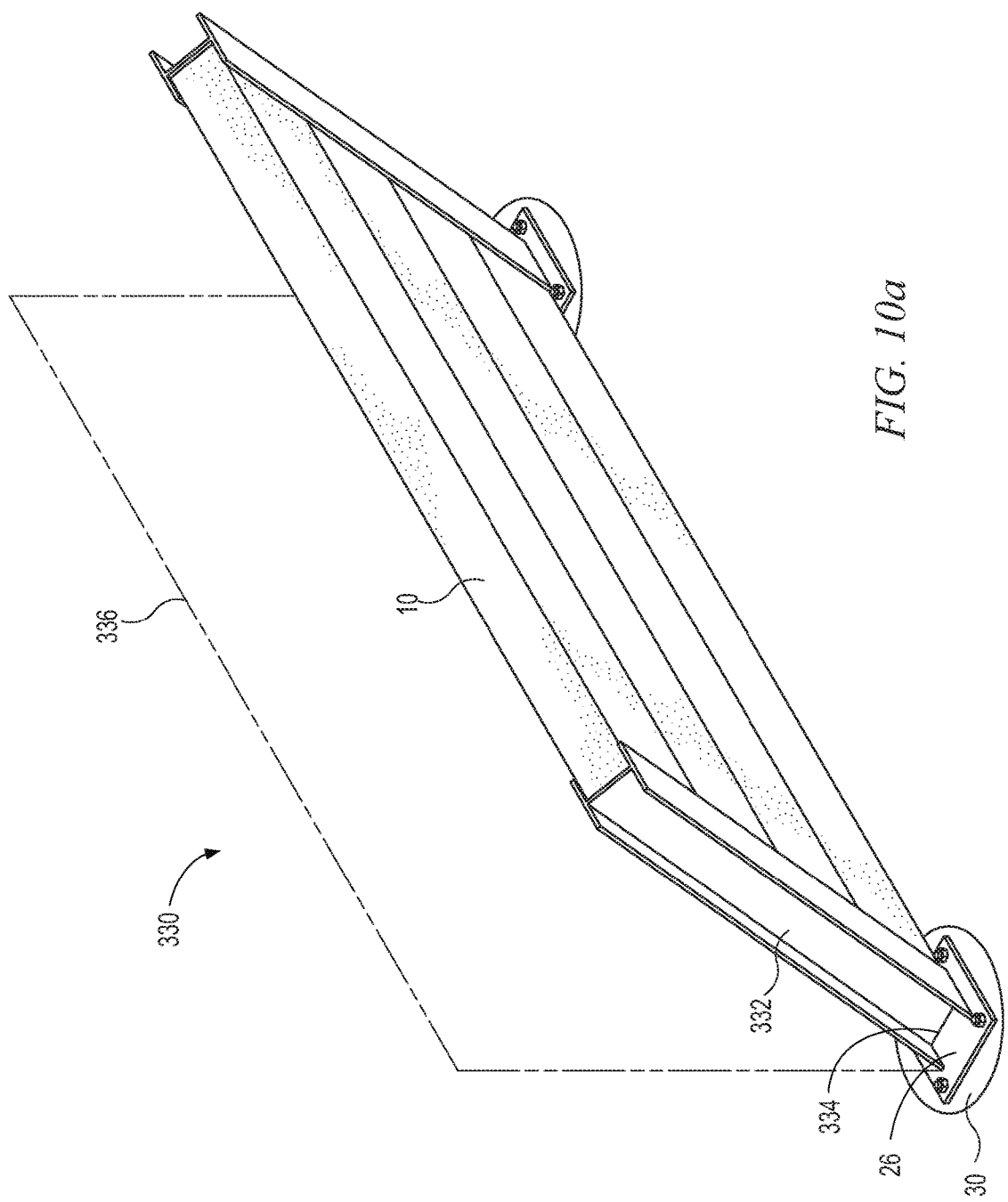
FIGS. 10a-10c illustrate alternative vertical support configurations.
Figure 10B:
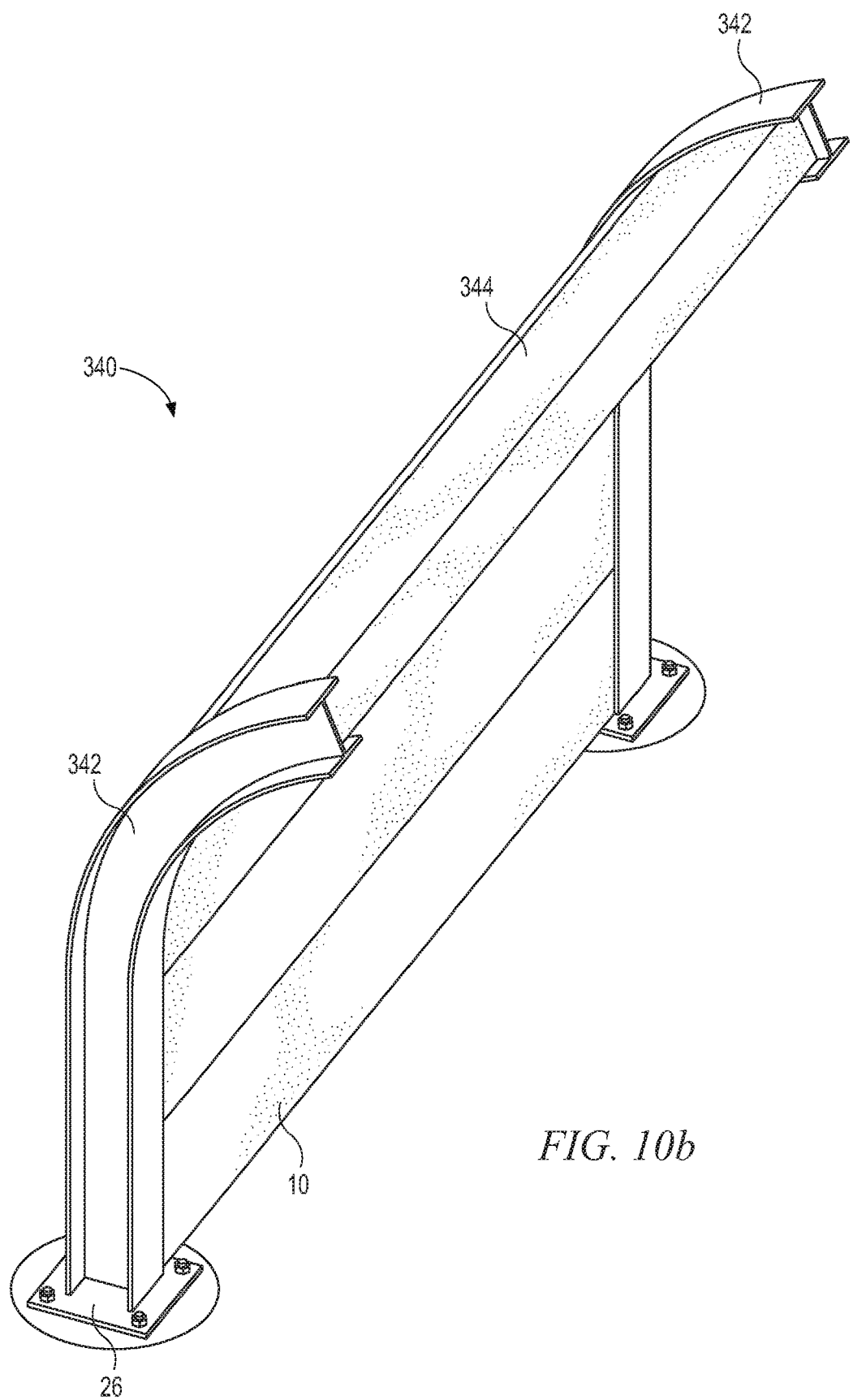
Figure 10C:
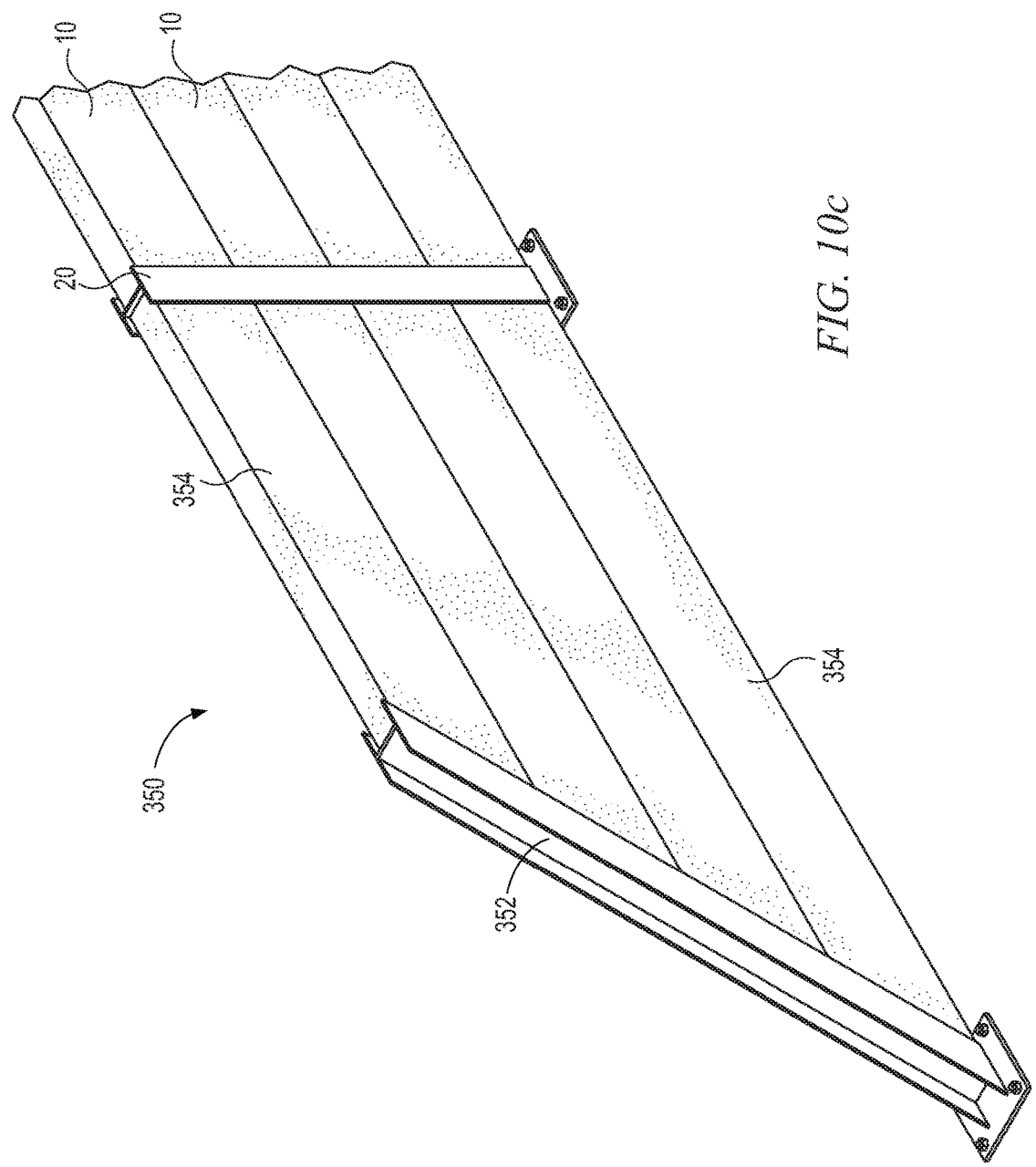

FIGS. 10a-10c show alternative configurations for the vertical supports used to build a barrier wall. FIG. 10a illustrates a barrier wall section 330 formed with slanted supports 332. Slanted supports 332 include ends 334 cut at a diagonal. Ends 334 are welded onto baseplates 26 and attached to footings 30, resulting in the supports 332 extending up at an angle rather than perpendicular to the ground as with supports 20. Slanted supports 332 allow formation of a barrier wall 330 that leans toward one side of the wall. For reference, line 336 illustrates the vertical plane. The angle of barrier wall 330 can be adjusted by modifying the cutting angle of ends 334. Any of the previously disclosed wall panels are used along with slanted supports 332. In some embodiments, the bottom wall panel is given a slanted bottom corresponding to the angle of supports 332.

FIG. 10b illustrates barrier wall 340 with rolled supports 342. Supports 342 are I-beams that have been worked between rollers to induce a curvature into the supports. Supports 342 can be rolled with a curvature along the entire height of barrier wall 340, or only for a portion of the height of the barrier wall. Any of the previously disclosed wall panels are used along with rolled supports 342. In some embodiments, the panels for curved regions of supports 342 are manufactured with a corresponding curvature.

FIG. 10c illustrates a battened barrier wall 350. The end of barrier wall 350 includes a support 352 slanted into the barrier wall. Barrier wall 350 remains vertical, except the end which slopes in toward the barrier wall. Wall panels 354 include sloped ends and varying lengths to correspond to the slope of support 352. Wall panels 354 can be based on any of the previously described wall panels, and may include sound absorbing strips 82, I-beams 110, and cables 140.

Figure 11C:
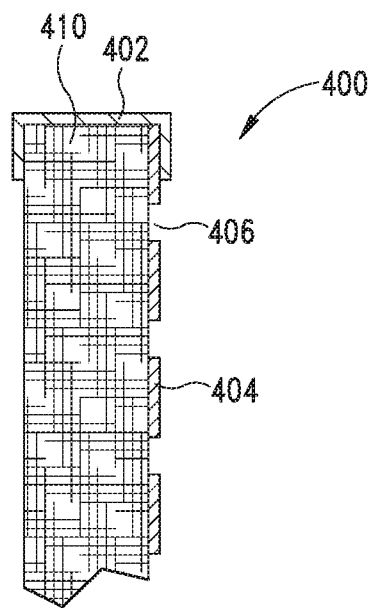
Figure 11D:
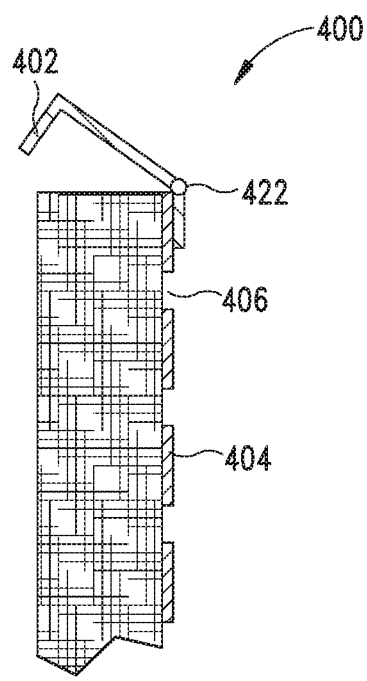

FIGS. 11a-11h illustrate mounting sound absorbing panels over a barrier wall. FIGS. 11a and 11b illustrate a sound absorbing panel 400 in plan view, while FIGS. 11c and 11d illustrate partial cross-sections. Sound absorbing panel 400 includes a U-channel frame 402. The frame 402 runs around the perimeter of each panel 400 with the U-channel oriented inward. A perforated (perf) sheet, panel, or plate 404 and a sheet of mineral wool 410 are held by frame 402 with the edges of the perf plate and mineral wool in the U-channels of frame.

FIG. 11a illustrates panel 400 viewed from the perf plate 404 side. Perf plate 404 is formed from a sheet of metal, e.g., sheet metal, gauge metal, angle iron, aluminum, etc. In other embodiments, perf plate 404 can be formed from other rigid materials, e.g., polymers, fiberglass, laminates, etc. The sheet of material that perf plate 404 is made out of has holes 406 formed through the sheet in a regular or irregular pattern. In one embodiment, holes 406 are formed in a sheet of metal 3/16 inches thick with the openings having 0.75 inch diameters and with centers of adjacent openings 1.5 inches apart. Rows of openings 406 can be staggered to allow the openings to be closer together. Mineral wool 410 is exposed through openings 406. FIG. 11b illustrates panel 400 from the mineral wool 410 side.

FIG. 11c illustrates a cross-section of a portion of panel 400. Perf plate 404 and mineral wool 410 are inserted into the U-channel of frame 402. The frame can be welded around perf plate 404 and mineral wool 410, or the perf plate and mineral wool can be deformed into the frame. FIG. 11d illustrates a sound absorbing panel 420 in an embodiment where one side of frame 402 includes a hinge 422. Hinge 422 allows one side of frame 402 to open. Opening frame 402 using hinge 422 allows mineral wool 410 to be replaced without removing the frame from the barrier wall. The hinge can be oriented at the top, bottom, or either side of panel 400. Mineral wool 410 may need to be replaced over time as the mineral wool may deteriorate from exposure to weather and wild animals. Hinge 422 facilitates replacement.

Figure 11E:
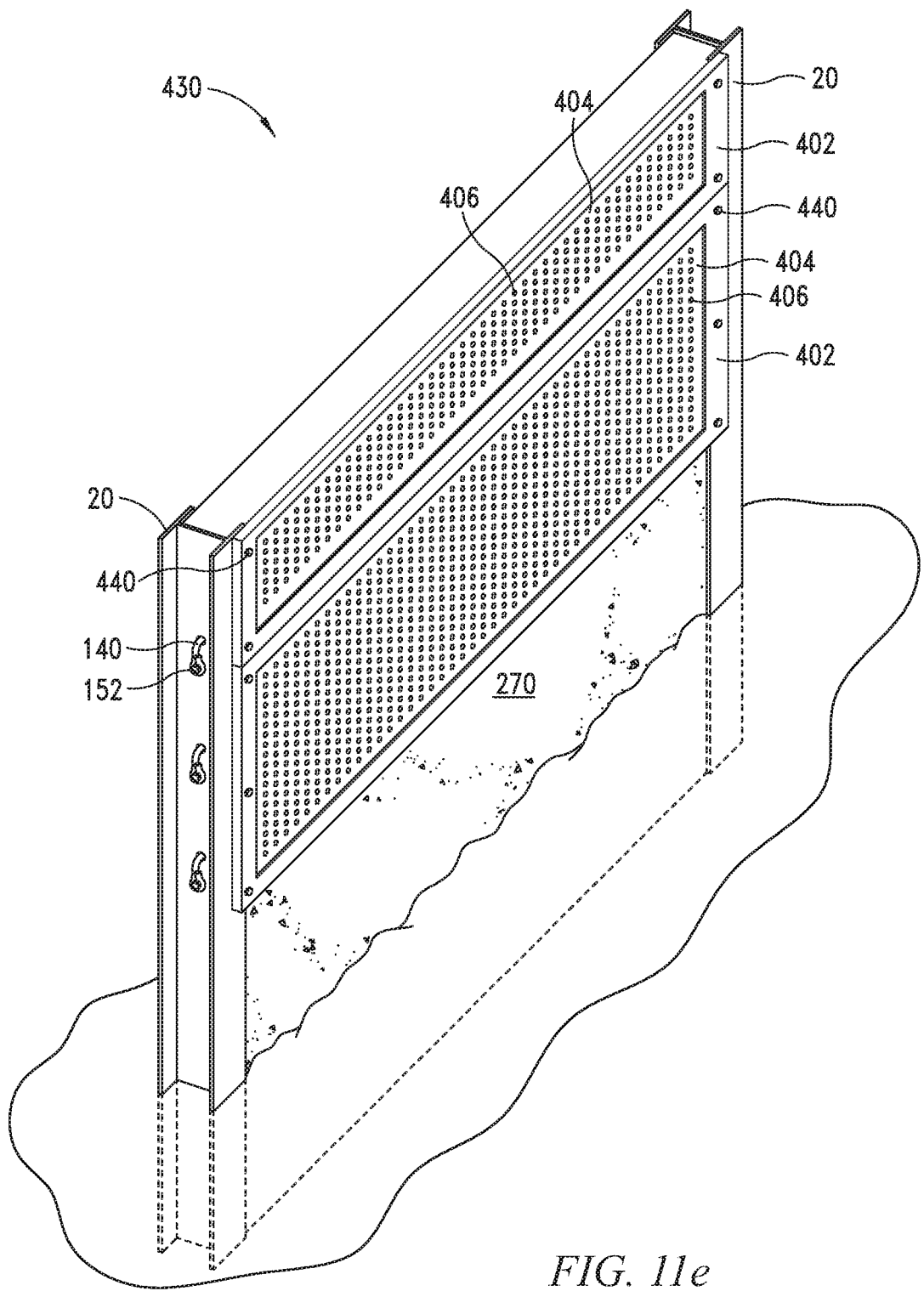

FIG. 11e illustrates a barrier wall section 430 with sound absorbing panels 400 disposed on a surface of the barrier wall section. The mineral wool 410 adds desirable sound absorption properties to improve sound dampening. Panels 400 can be used along with any of the above described wall panels, including to supplement the sound dampening properties of wall panels 70 having sound absorbing strips 82.

Panels 400 are disposed on wall 430 with perf panel 404 oriented away from the underlying wall panels. Perf panel 404 provides structural support for keeping mineral wool 410 flat and vertical by trapping the mineral wool between barrier wall 430 and the perf panel. Openings 406 allow sound waves hitting barrier wall 430 to bypass perf plate 404 and be absorbed by mineral wool 410. Larger openings 406 allow more sound waves to be absorbed by exposing more mineral wool 410. However, larger openings 406 may be problematic depending on the local wildlife. If hole are made too large, birds could try to nest in mineral wool 410. Circumstances of the installation location may be taken into consideration when selecting parameters of perf plate 404. In most cases, the diameter of openings 406 will be limited to about an inch, but larger openings can be used.

Panels 400 can be formed in various dimensions depending on need. In many embodiments, the horizontal length of panels 400 matches the length of the underlying wall panels. The height of sound absorbing panels 400 can match the height of the wall panels, or can be another height. In some embodiments, sound absorbing panels 400 are formed with a height that is a multiple of the wall panel height, e.g., for a 2 foot tall wall panel, panels 400 could be formed two feet tall, four feet tall, or eight feet tall. FIG. 11e illustrates a two foot tall sound absorbing panel 400 over a four foot tall sound absorbing panel. In one embodiment, a sixteen foot tall wall is covered by two eight foot tall panels 400.

Figure 11F:
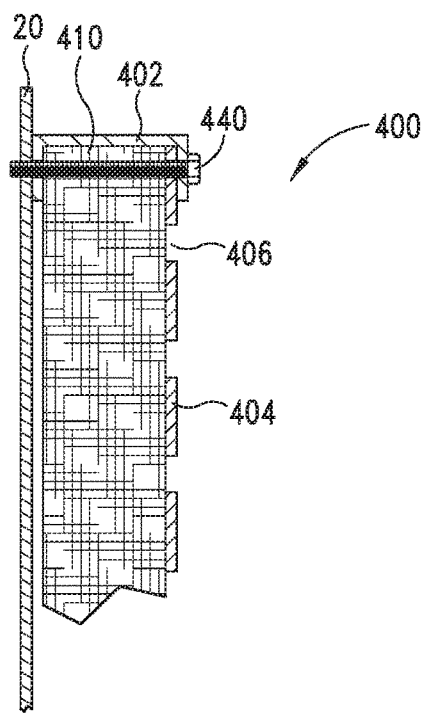
Figure 11G:
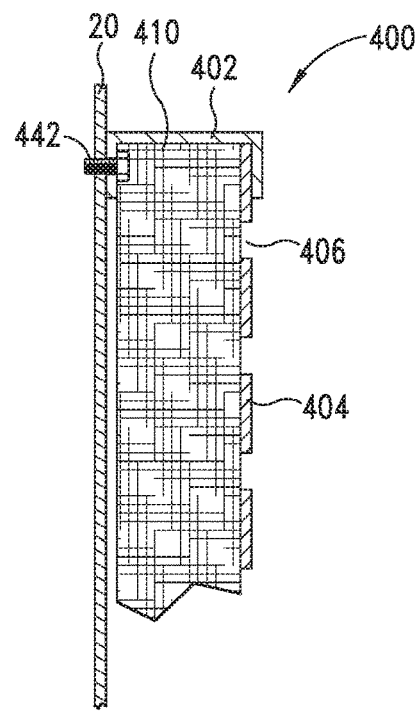
Figure 11H:
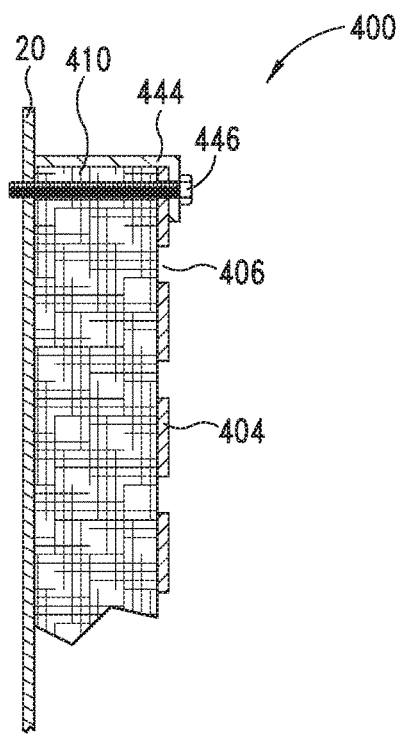

Panels 400 can be attached to wall 400 by bolts 440, by welding frame 402 to vertical support beams 20, or another suitable means. Bolts 440 extend completely through frame 402, mineral wool 410, and perf plate 404 to attach panel 400 to support 20 as shown in FIG. 11f. Bolt 440 can be attached to a threaded opening of support 20, or can be attached by a nut on the other side of the support. FIG. 11g illustrates an alternative where the arm of frame 402 closer to support 20 is bolted to the support with a shorter bolt 442. In FIG. 11h, an L-frame is used instead of a U-frame. The L-frame only includes a single extension to hold perf plate 404 and mineral wool 410 onto the barrier wall. The lack of an extension on the back side of panel 400, between mineral wool 410 and support 20, facilitates easier replacement of the mineral wool when frame 402 is unbolted from the support.

Figure 12A:
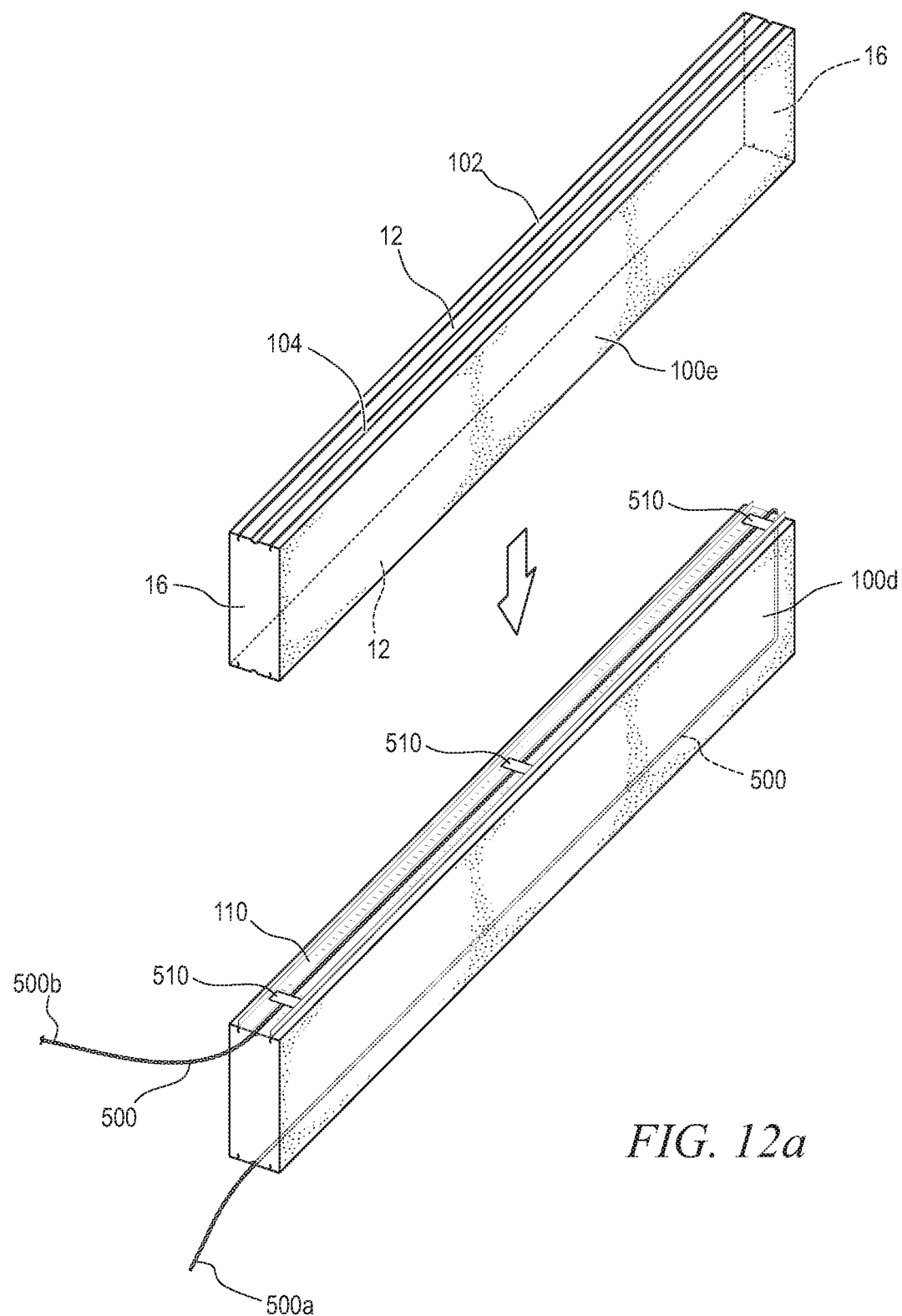
FIGS. 12a-12f illustrate additional embodiments with a cable disposed between wall panels to attach the panels to vertical supports.

FIGS. 12a-12f illustrate additional embodiments of cables disposed between wall panels to attach the panels to vertical supports. In FIG. 12a, I-beams 110 are disposed on the top and bottom surfaces 12 of wall panel 100d. The bottom I-beam 110 only has flanges 112 extending upward into wall panel 100d, because wall panel 100d is the bottom wall panel and not having downward flanges allows the wall panel to sit on a flat surface more naturally. In other embodiments, an I-beam 110 with flanges 112 extending in both directions is used on the bottom of wall panel 100d.

Figure 12B:
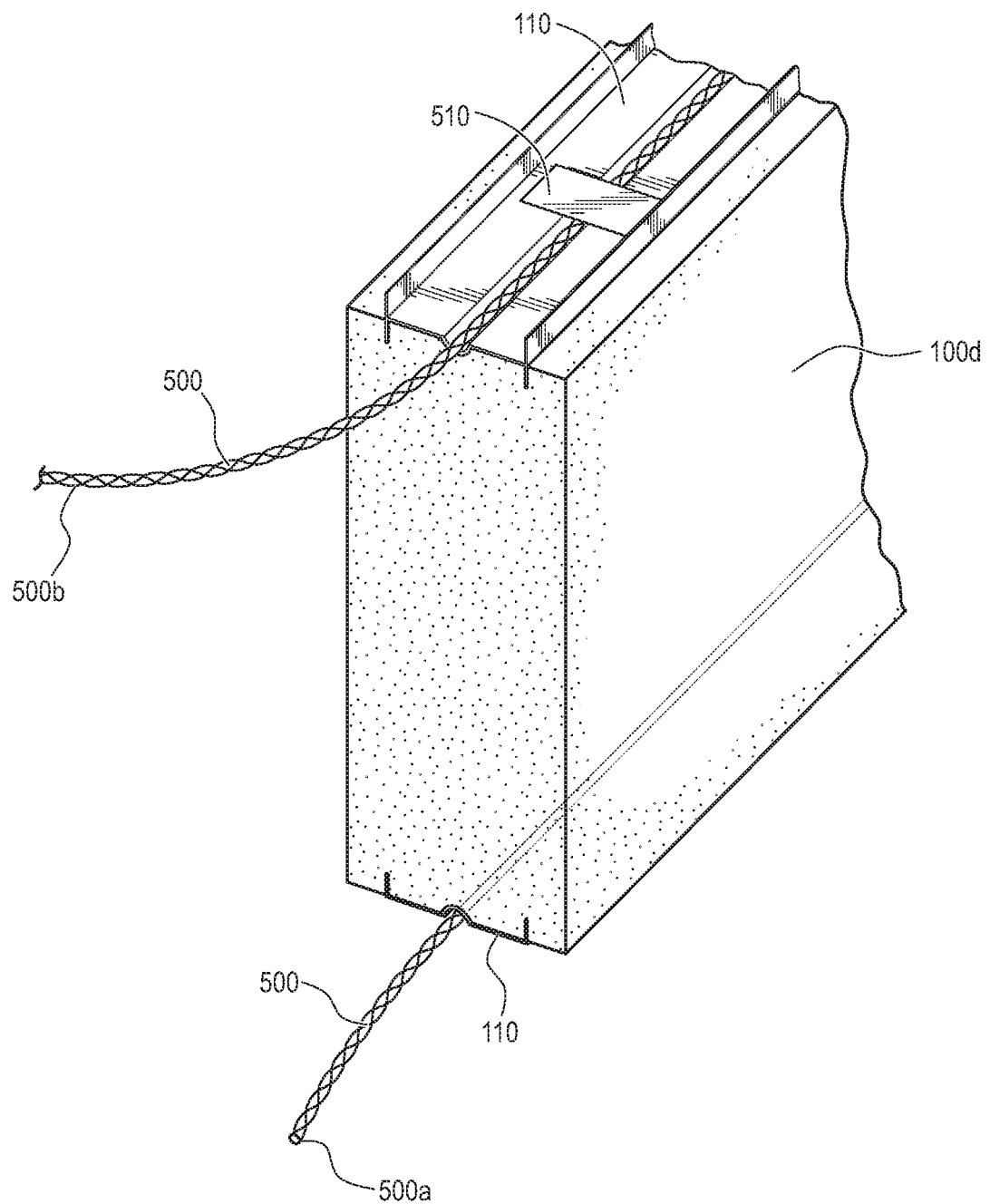

A cable 500 is routed through ridge 114 of I-beams 110. Cable 500 has a tail 500a at a first end of the cable that is allowed to extend out some distance from the end of the bottom I-beam 110. The cable is routed through groove 114 of the bottom I-beam 110, up the back end 16 of wall panel 100d, and through the groove in the top I-beam. Second end 500b of cable 500 is not fully illustrated, and should be of sufficient length to snake up and across each wall panel 100 being stacked on top of wall panel 100d. Cable 500 is routed along three of the four surfaces 12 and 16 of wall panel 100d, and includes two loose ends 500a and 500b at the end of the wall panel oriented toward the viewer in FIG. 12a. FIG. 12b illustrates and enlargement of the end of wall panel 100d oriented toward the user to enhance detail.

In some embodiments, cable 500 has a 3/16 or 1/4-inch diameter. Cable 500 can be made thin enough to fit completely within a single groove 104/114 to allow stacked wall panels 100 to have flat bottoms. Cable 500 can be made thin enough to fit two cables within a single groove 104/114 in embodiments where cable 500 is doubled up to return end 500b to tail 500a. Brackets or straps 510 are optionally attached to I-beams 110 over cable 500 to keep the cable in place within grooves 114. Straps 510 can be welded, screwed, rivetted, bolted, or glued onto I-beams 110, or attached by any other suitable mechanism. In one embodiment, straps 510 are 16-gauge strips of sheet metal. Straps 510 can be added to I-beams 110 when the I-beams are manufactured, and then cable 500 is threaded under the straps. In other embodiments, straps 510 are attached after disposing cable 500 in each individual groove 104/114.

Figure 12C:
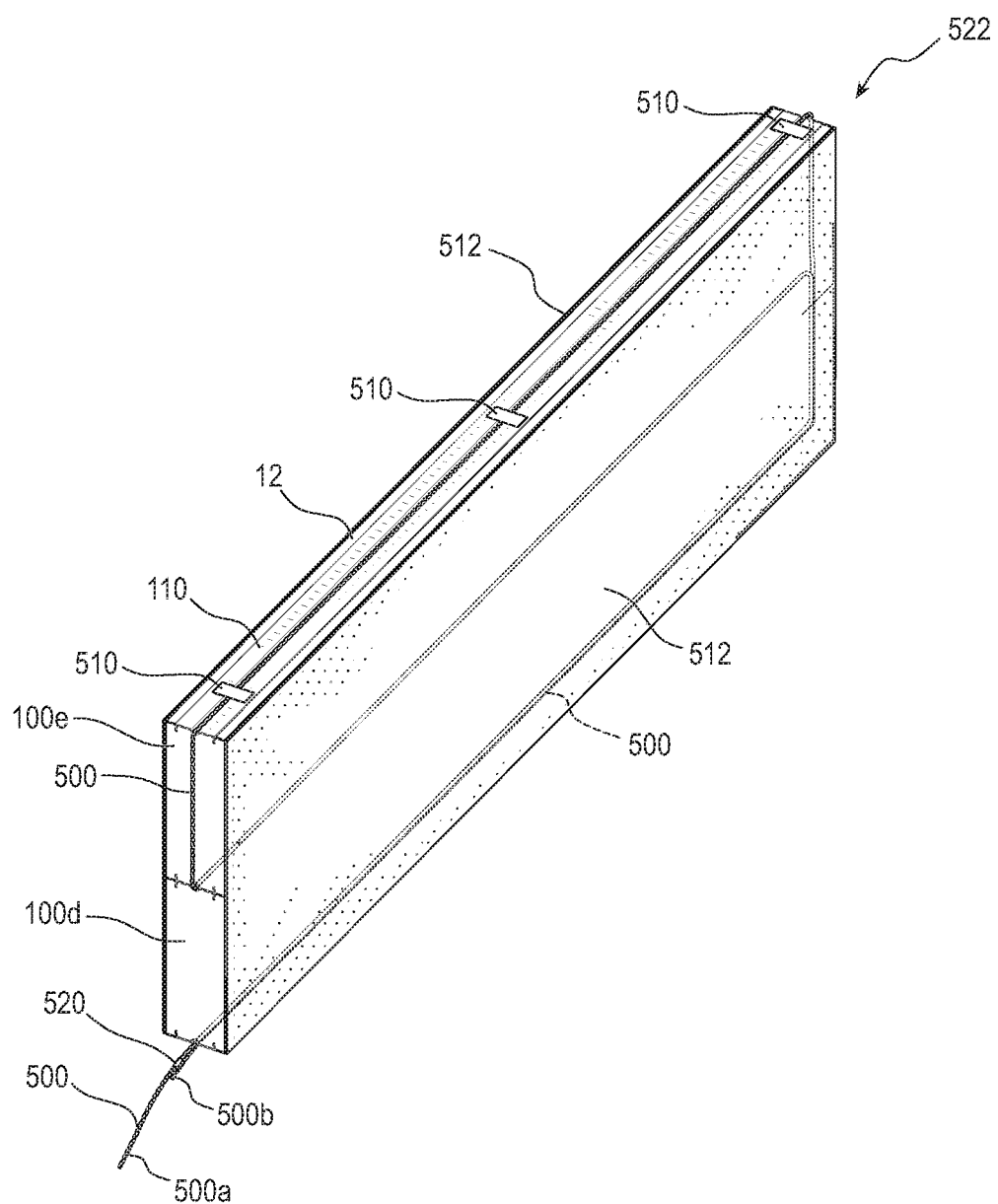

In FIG. 12c, wall panel 100e is set on top of wall panel 100d. In some embodiments, wall panel 100e has a groove 104 on the bottom surface 12. In other embodiments, wall panel 100e only has grooves 102 or is totally flat on the bottom surface 16.

Flanges 12 of the I-beam 110 between wall panels 100d and 100e extend into grooves 102 of wall panel 100e. A third I-beam 110 is disposed on top of wall panel 100e. The top I-beam 110 only has flanges 112 extending downward into wall panel 100e because wall panel 100e is the top wall panel in this embodiment. In other embodiments, flanges 112 can extend upward from wall panel 100e whether or not wall panel 100e is the top wall panel.

End 500b of cable 500 is routed up the near surface 16 of wall panel 100e and into groove 114 of I-beam 110 on top of wall panel 100e. Cable 500 is wrapped down the back surfaces 16 of both wall panels 100d and 100e to the bottom of the stack and then doubled-up with the portion of cable 500 that was previously routed under wall panel 100d. End 500b is cut just outside of wall panel 100d and attached to tail 500a by a crimping sleeve 520, clamp, or another suitable mechanism. End 500b can be cut shorter in other embodiments, and attached to cable 500 at any point along bottom surface 12 or back surface 16 of wall panel 100d after fully looping around wall panel 100e.

A wall segment 522 with two stacked wall panels 100 is completed in FIG. 12c by forming a stucco or other suitable coating 512 on the front and back surfaces of the wall panels. Stucco coating 512 has sufficient physical strength to keep wall panel 100e attached to wall panel 100d. Snaking a single cable 500 both over and under each wall panel 100 in wall segment 522 allows each wall panel to be attached to a vertical support using only a single cable. Stucco coating 512 keeps wall panels 100 assembled to reduce the likelihood of cable 500 unraveling from between the wall panels. Tail 500a provides a single point of attachment that can hold each wall panel 100 of wall segment 522.

Figure 12D:
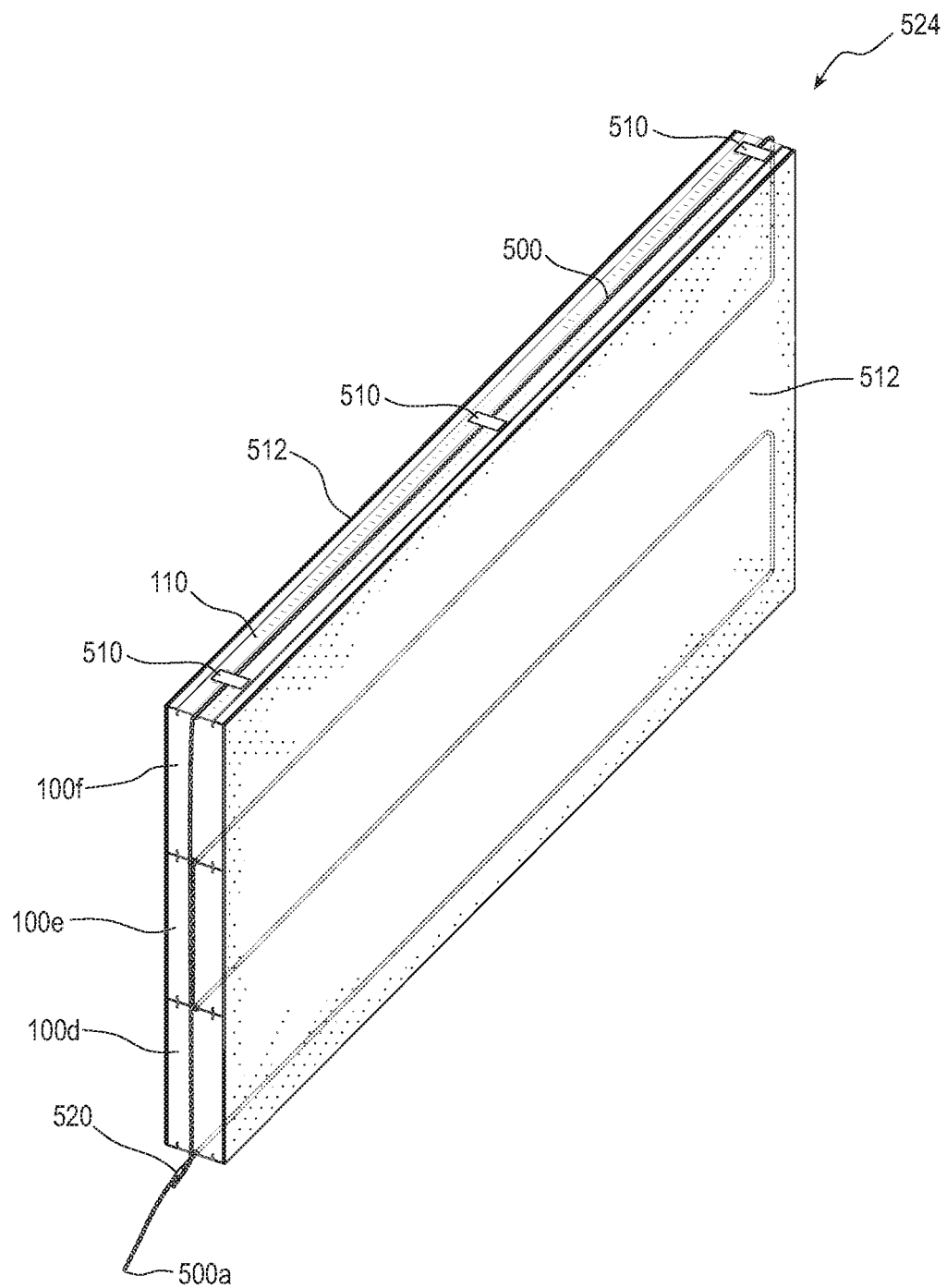

FIG. 12d illustrates a wall segment 524 with three stacked wall panels 100d, 100e, and 100f. Wall panels 100d and 100e are stacked with cable 500 in a similar manner as described above. After stacking wall panel 100e on wall panel 100d, and routing cable 500 over wall panel 100e, a third wall panel 100f is stacked on top of wall panel 100e. Wall panel 100e has an I-beam 110 on top with flanges 112 extending upward to fit into bottom grooves 102 of wall panel 100f. Another I-beam 110 is disposed on top of wall panel 100f.

Rather than routing end 500b of cable 500 down from on top of wall panel 100d at the back end, cable 500 is routed up and then along the top of wall panel 100f to the end oriented toward the viewer. End 500b of cable 500 is extended down the near side of wall panels 100d, 100e, and 100f to meet up with tail 500a. As in FIG. 12c, end 500b is attached to tail 500a just outside the footprint of wall panel 100d. End 500b could also be attached to cable 500 where the cable wraps around end surface 16 of wall panel 100d.

Cable 500 snakes up wall segment 524 over and under each wall panel 100, and then returns from the top wall panel to attach to tail 500a. Wall segment 522 includes two wall panels 100 and wall segment 524 includes three wall panels. However, any arbitrary number of wall panels 100 can be stacked in other embodiments. Each subsequent wall panel 100 is stacked after laying cable 500 on the previous wall panel. Once all desired wall panels 100 are stacked, end 500b of cable 500 is returned and attached to tail 500a or another portion of cable 500. If an odd number of wall panels 100 is used, end 500b will be at the same end of the stack as tail 500b, and simply dropped down and attached. If an even number of wall panels 100 is used, end 500b will be at the opposite end of the wall segment and cable 500 is routed down then under the bottom wall panel to return to tail 500. Coating 512 is applied over all wall panels 100 to keep the wall segment together.

Figure 12E:
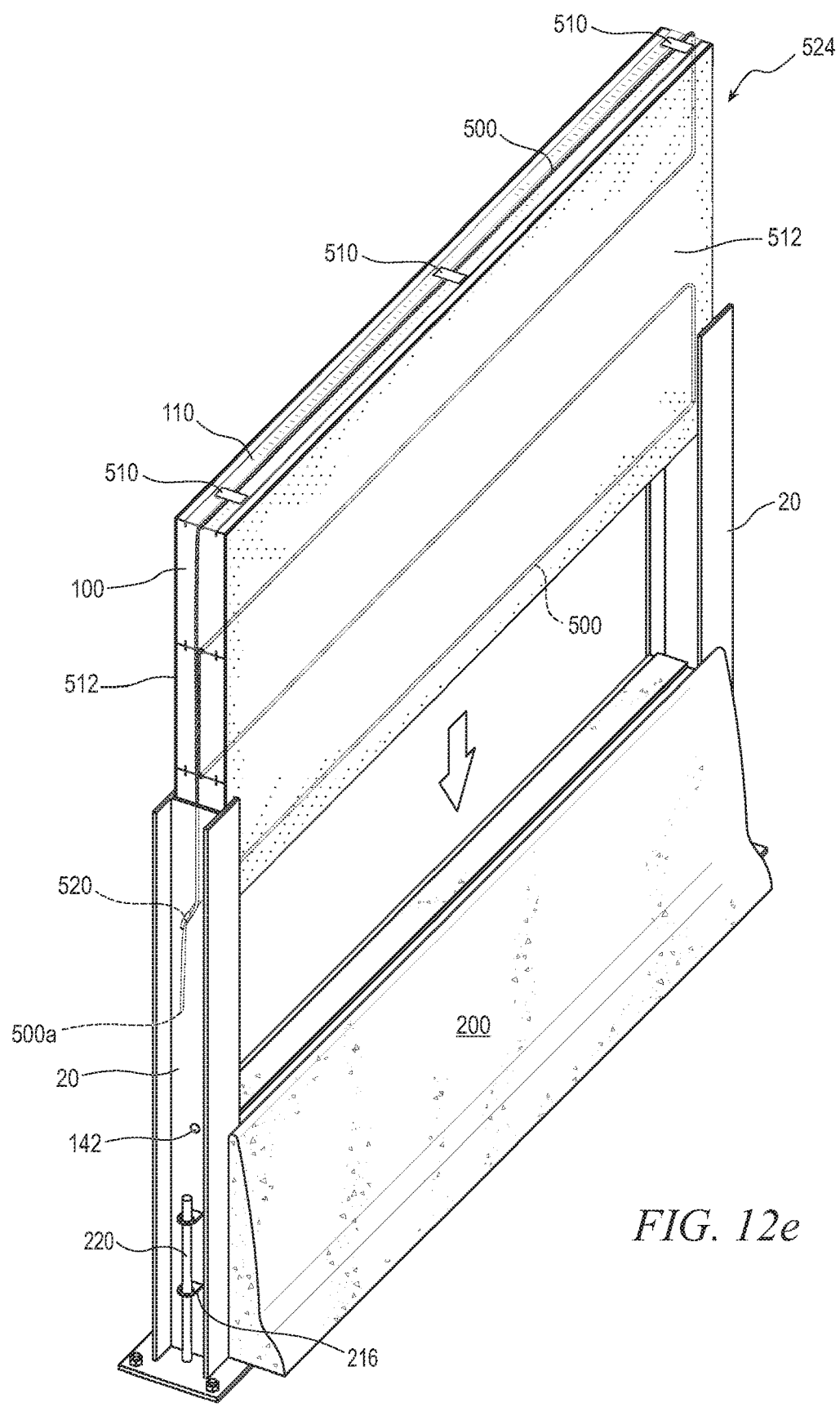
Figure 12F:
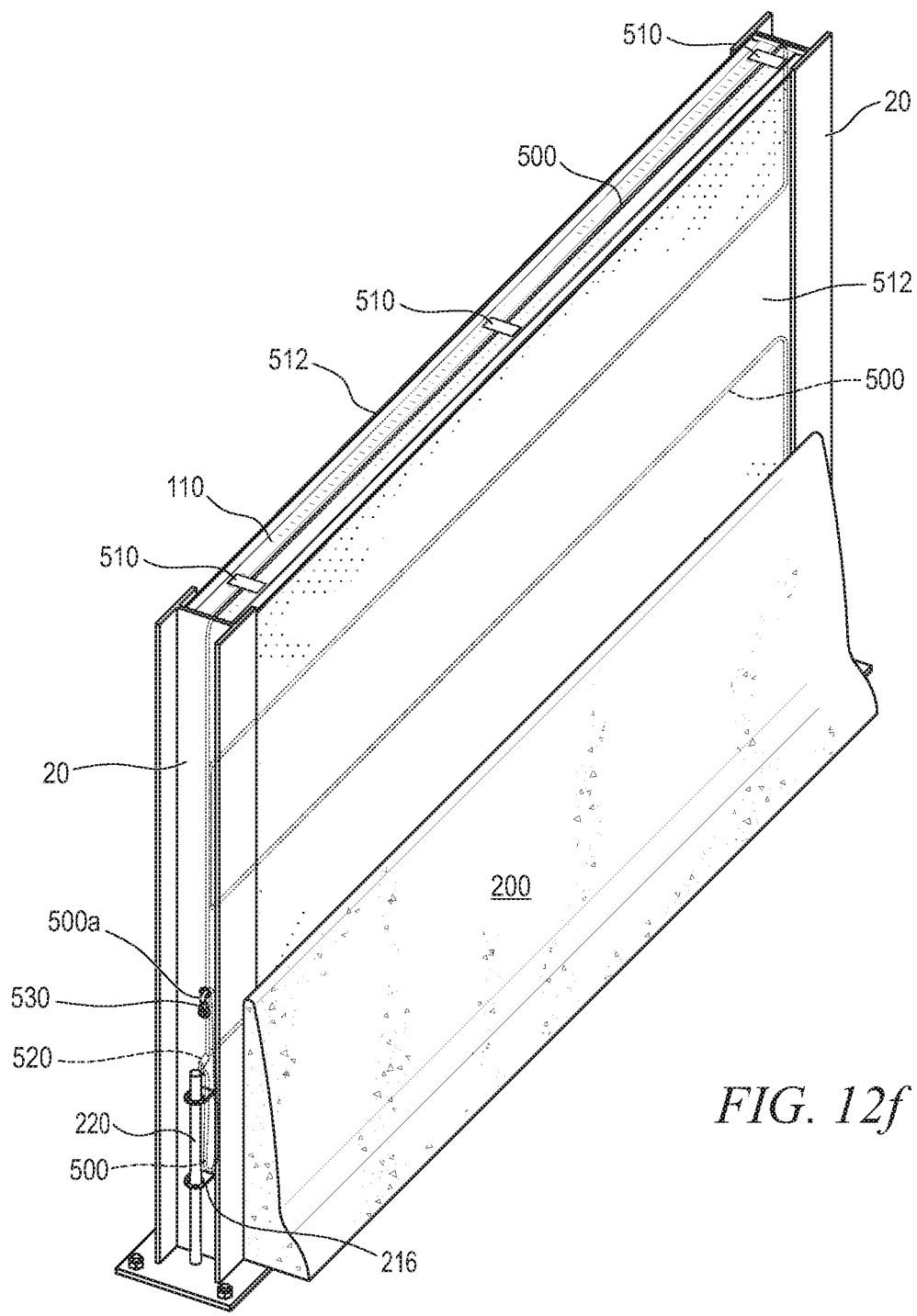

In FIG. 12e, wall segment 524 is disposed on traffic barrier 200 between vertical supports 20. Tail 500a hangs down between flanges of one of the vertical supports. In FIG. 12f, wall segment 524 rests on traffic barrier 200. Tail 500a is inserted through opening 142 and bolted onto the web of vertical support 20 at joint 530. In some embodiments, tail 500a is long enough that the tail can be attached to vertical support 500 prior to lifting up wall segment 524 to insert the wall segment between vertical supports 20. Tail 500a can also be attached to the side of vertical support 20 with wall segment 524 without extending through opening 142, or attached to any other surface of vertical support 20 with or without extending through an opening.

Tail 500a attached to vertical support 20 provides a single point of attachment for an entire wall segment of any size. Cable 500 keeps wall segments attached to vertical supports when the wall segments are knocked loose, e.g., by vehicle traffic hitting the barrier wall. Otherwise, the wall segment may end up falling and causing significant damage to persons and property. In many cases barrier walls are formed on bridges or overpasses, where a wall segment could fall significant distance onto buildings, trafficways, or pedestrian walking paths if not secured by cable 500. Cable 500 increases safety of barrier walls formed from wall panels while only requiring a single attachment point per wall segment. Cable 500 is compatible with any of the above described wall panel embodiments, e.g., wall panel 160 with sound absorbing strips 82.

While one or more embodiments of the present invention have been illustrated in detail, the skilled artisan will appreciate that modifications and adaptations to those embodiments may be made without departing from the scope of the present invention as set forth in the following claims.

What is claimed is:

1. A barrier wall, comprising:
   a first vertical support;
   a second vertical support; and a first wall segment disposed between the first vertical support and second vertical support, the first wall segment including,
  a first wall panel comprising a first groove disposed between the first vertical support and second vertical support,
  a second wall panel comprising a second groove disposed between the first vertical support and second vertical support,
  an I-beam disposed between the first wall panel and second wall panel, wherein the I-beam includes a third groove disposed in the first groove, and
  a cable disposed in the first groove of the first wall panel, the second groove of the second wall panel, and the third groove of the I-beam, wherein the cable is attached to the first vertical support.

2. The barrier wall of claim 1, wherein the cable extends through an opening in the first vertical support.

3. The barrier wall of claim 1, further including a coating disposed over side surfaces of the first wall panel and second wall panel.

4. The barrier wall of claim 1, further including a strap disposed over the cable.

5. The barrier wall of claim 1, wherein a first portion of the cable in the first groove is disposed between the first wall panel and second wall panel, wherein the first portion of the cable is disposed in a third groove of the second wall panel.

6. The barrier wall of claim 5, wherein the second groove is formed in a surface of the second wall panel opposite the third groove.

7. A barrier wall segment, comprising:
a first wall panel comprising a first groove;
a second wall panel comprising a second groove; and
a cable disposed in the first groove of the first wall panel and the second groove of the second wall panel, wherein a first end of the cable forms a tail extending from the barrier wall segment and a second end of the cable is looped around the second wall panel and attached to the cable between the first end and second end.

8. The barrier wall segment of claim 7, wherein the first groove is formed in a first surface of the first wall panel that is oriented toward the second wall panel and the second groove is formed in a second surface of the second wall panel that is oriented away from the first wall panel.

9. The barrier wall segment of claim 7, further including a third wall panel disposed over the first wall panel and second wall panel, wherein the cable is disposed in a third groove of the third wall panel.

10. The barrier wall segment of claim 7, further including a coating disposed on the first wall panel and second wall panel.

11. The barrier wall segment of claim 7, further including a third groove formed in the first wall panel opposite the first groove, wherein the cable is disposed in the third groove.

12. The barrier wall segment of claim 7, further including an I-beam disposed between the first wall panel and second wall panel, wherein the I-beam includes a third groove disposed in the first groove.

13. The barrier wall of claim 12, wherein the cable is disposed in the third groove of the I-beam.

14. A method of making a barrier wall, comprising:
providing a first wall panel comprising a first groove;
disposing a cable in the first groove;
disposing a second wall panel comprising a second groove over the first wall panel;
disposing the cable in the second groove; and
attaching an end of the cable to a portion of the cable.

15. The method of claim 14, further including forming a coating on the first wall panel and second wall panel.

16. The method of claim 14, further including:
disposing a third wall panel comprising a third groove over the first wall panel and second wall panel; and
disposing the cable in the third groove while the cable remains extending into the first groove and second groove.

17. The method of claim 14, further including:
providing an I-beam including a third groove;
disposing the I-beam over the first wall panel with the third groove in the first groove; and
disposing the cable in the third groove.

18. The method of claim 14, further including disposing the first wall panel and second wall panel between a first vertical support and second vertical support after attaching the end of the cable to the portion of the cable.

19. The method of claim 18, further including attaching the cable to the first vertical support.

* * * * *